US012721121B2

(12) United States Patent
Kabuyanagi et al.

(10) Patent No.: US 12,721,121 B2
(45) Date of Patent: Aug. 25, 2026

(54) SEMICONDUCTOR DEVICE AND METHOD OF MANUFACTURING THE SAME

(71) Applicant: Kioxia Corporation, Tokyo (JP)

(72) Inventors: Shoichi Kabuyanagi, Yokkaichi Mie (JP); Tsuyoshi Sugisaki, Yokkaichi Mie (JP); Shosuke Fujii, Kuwana Mie (JP)

(73) Assignee: Kioxia Corporation, Tokyo (JP)

( * ) Notice: Subject to any disclaimer, the term of this patent is extended or adjusted under 35 U.S.C. 154(b) by 554 days.

(21) Appl. No.: 18/182,583

(22) Filed: Mar. 13, 2023

(65) Prior Publication Data

US 2023/0402322 A1 Dec. 14, 2023

(30) Foreign Application Priority Data

Jun. 10, 2022 (JP) ................................. 2022-094583

(51) Int. Cl.

| | |
|---|---|
| ***H10W 20/00*** | (2026.01) |
| ***H10D 30/63*** | (2025.01) |
| ***H10D 62/13*** | (2025.01) |
| ***H10D 64/27*** | (2025.01) |

(52) U.S. Cl.

CPC ........ *H10W 20/056* (2026.01); *H10D 62/151* (2025.01); *H10D 64/519* (2025.01); *H10W 20/063* (2026.01); *H10D 30/63* (2025.01)

(58) Field of Classification Search

CPC .... H10D 64/519; H10D 62/151; H10D 30/63; H01L 21/76897; H01L 21/76877; H01L 21/76885; H10W 20/42; H10W 20/069; H10W 20/063; H10W 20/056

See application file for complete search history.

(56) References Cited

U.S. PATENT DOCUMENTS

| | | | |
|---|---|---|---|
| 8,823,082 B2 | 9/2014 | Yanagisawa | |
| 9,953,973 B1 * | 4/2018 | Balakrishnan | H10D 84/0142 |
| 10,312,234 B2 * | 6/2019 | Balakrishnan | H10D 84/811 |
| 2012/0070953 A1 * | 3/2012 | Yu | H01L 21/2236 257/E21.409 |
| 2019/0237581 A1 * | 8/2019 | Saito | H10D 30/031 |
| 2020/0152624 A1 | 5/2020 | Balakrishnan et al. | |
| 2020/0381557 A1 | 12/2020 | Hattori et al. | |
| 2021/0305431 A1 | 9/2021 | Ishimaru et al. | |

(Continued)

FOREIGN PATENT DOCUMENTS

JP 2015-109426 A 6/2015

*Primary Examiner* — John M Parker

(74) *Attorney, Agent, or Firm* — Foley & Lardner LLP

(57) ABSTRACT

A semiconductor device according to an embodiment includes a first conductor, a first oxide semiconductor, a first insulator, a second conductor, a third conductor, and a fourth conductor. The first oxide semiconductor contacts, at one end, the first conductor, and extends in a first direction intersecting a surface of the first conductor. The first insulator surrounds a side surface of the first oxide semiconductor. The second conductor and the first oxide semiconductor interpose the first insulator therebetween. The third conductor contacts another end of the first oxide semiconductor. The fourth conductor extends in a second direction intersecting the first direction, and contacts a second conductor on a side opposite to the first insulator. The second conductor is of a material with a higher work function than a material of the fourth conductor.

15 Claims, 42 Drawing Sheets

(56) References Cited

U.S. PATENT DOCUMENTS

| | | | | |
|---|---|---|---|---|
| 2022/0068925 | A1 | 3/2022 | Kawai et al. | |
| 2022/0069131 | A1 | 3/2022 | Pesic | |
| 2023/0200065 | A1 * | 6/2023 | Gardner ................. | H10B 41/41 257/314 |

* cited by examiner

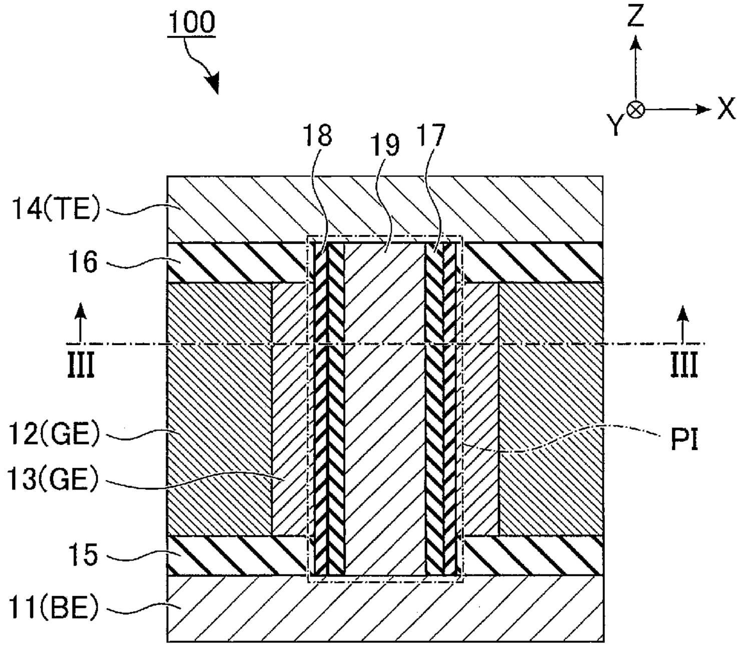
F I G. 2

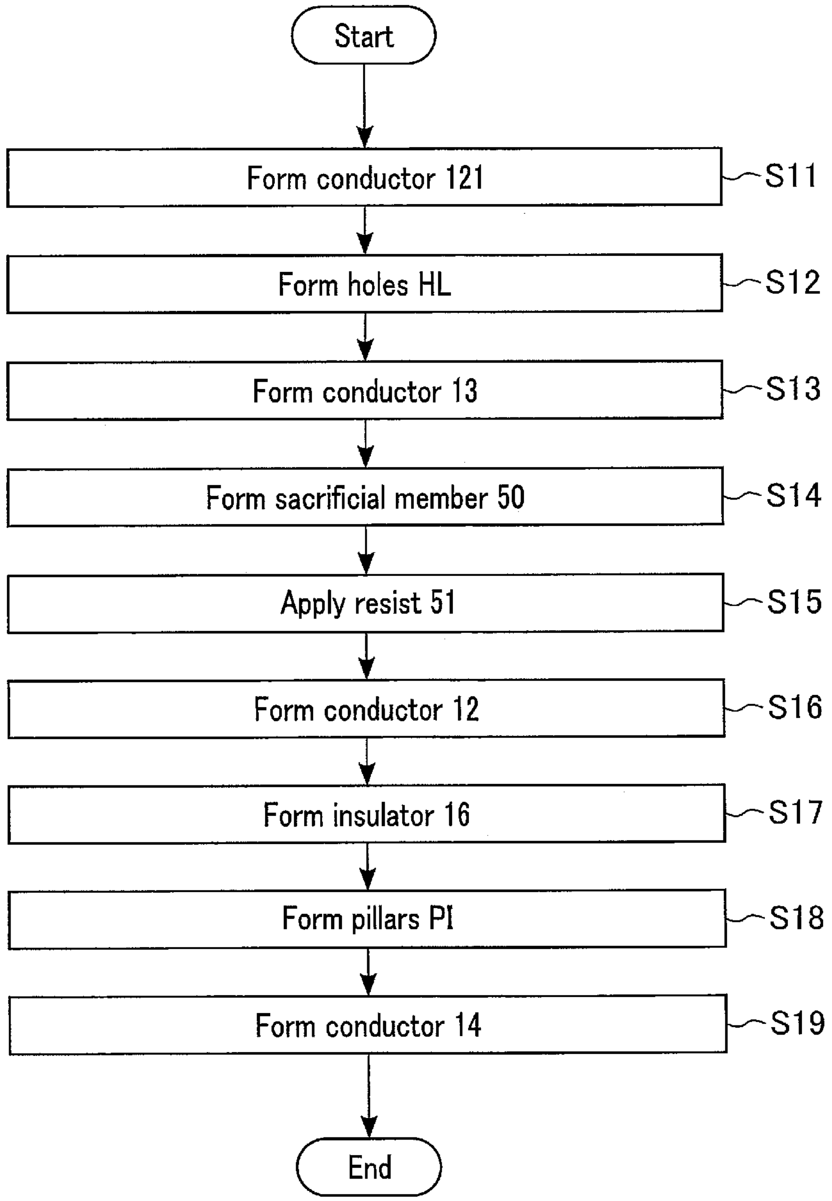
F I G. 4

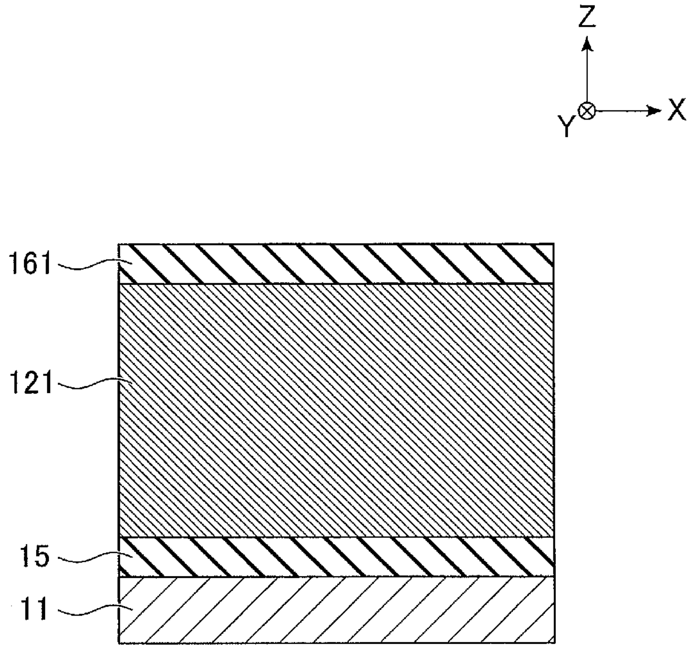
F I G. 5

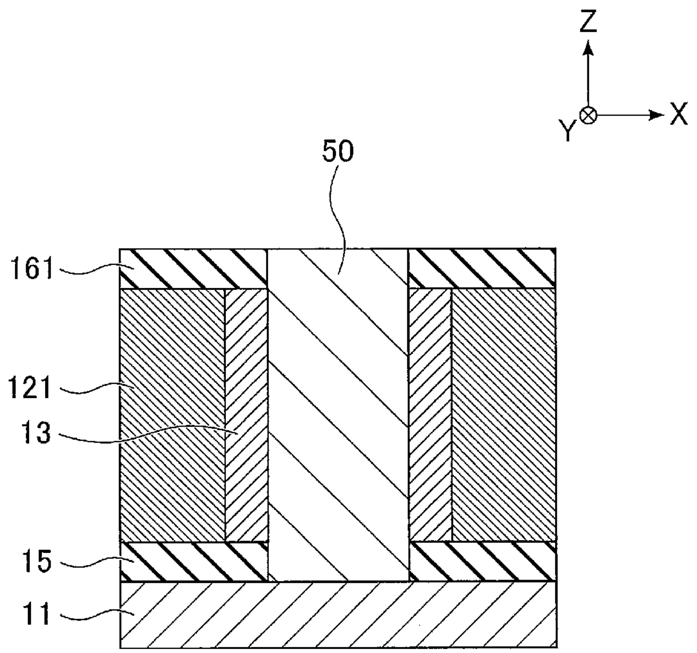
F I G. 10

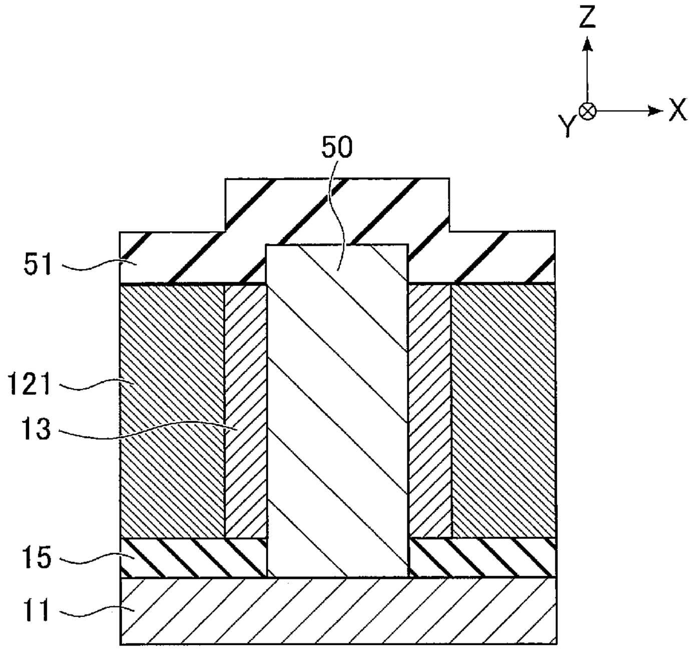
F I G. 12

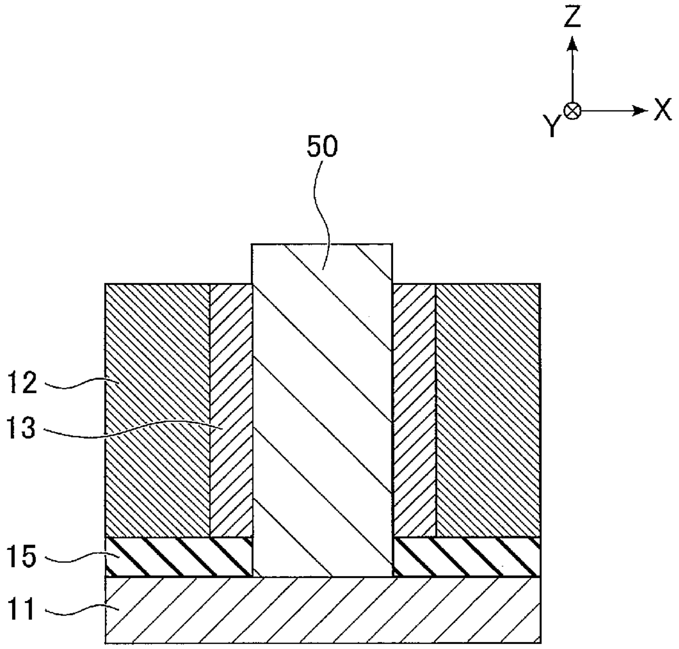
F I G. 14

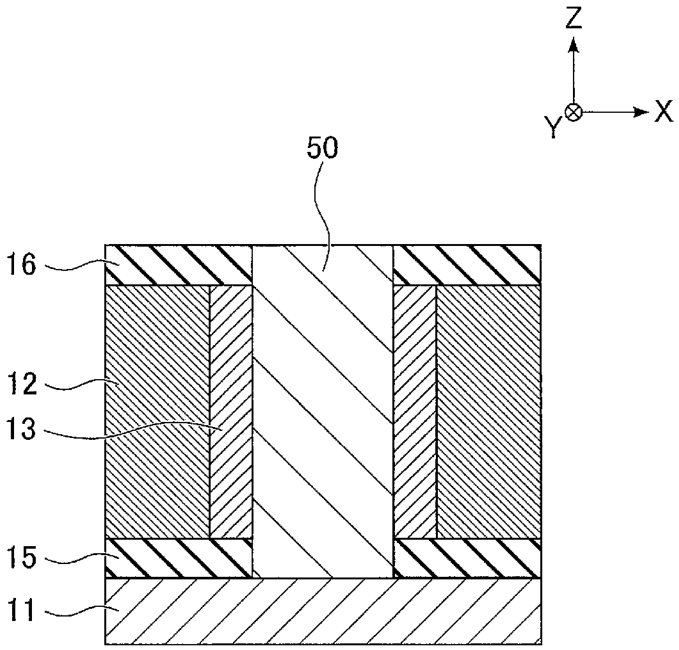
F I G. 16

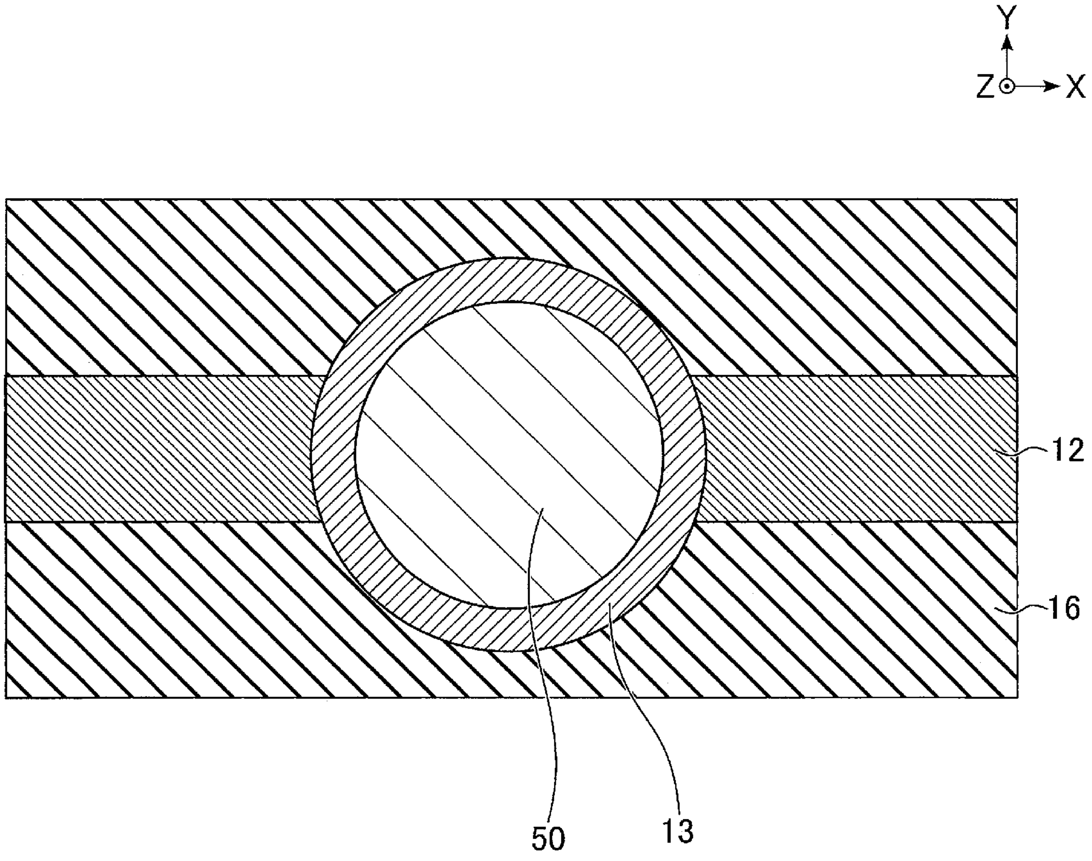
F I G. 17

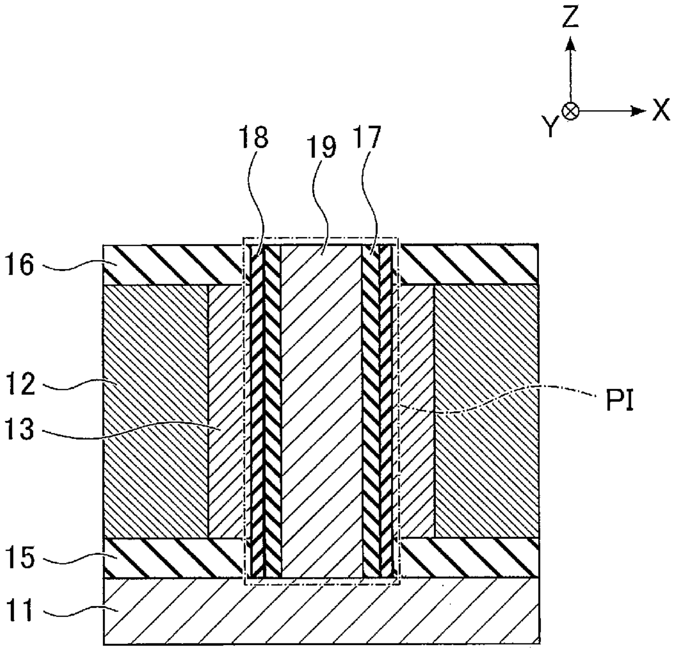
F I G. 18

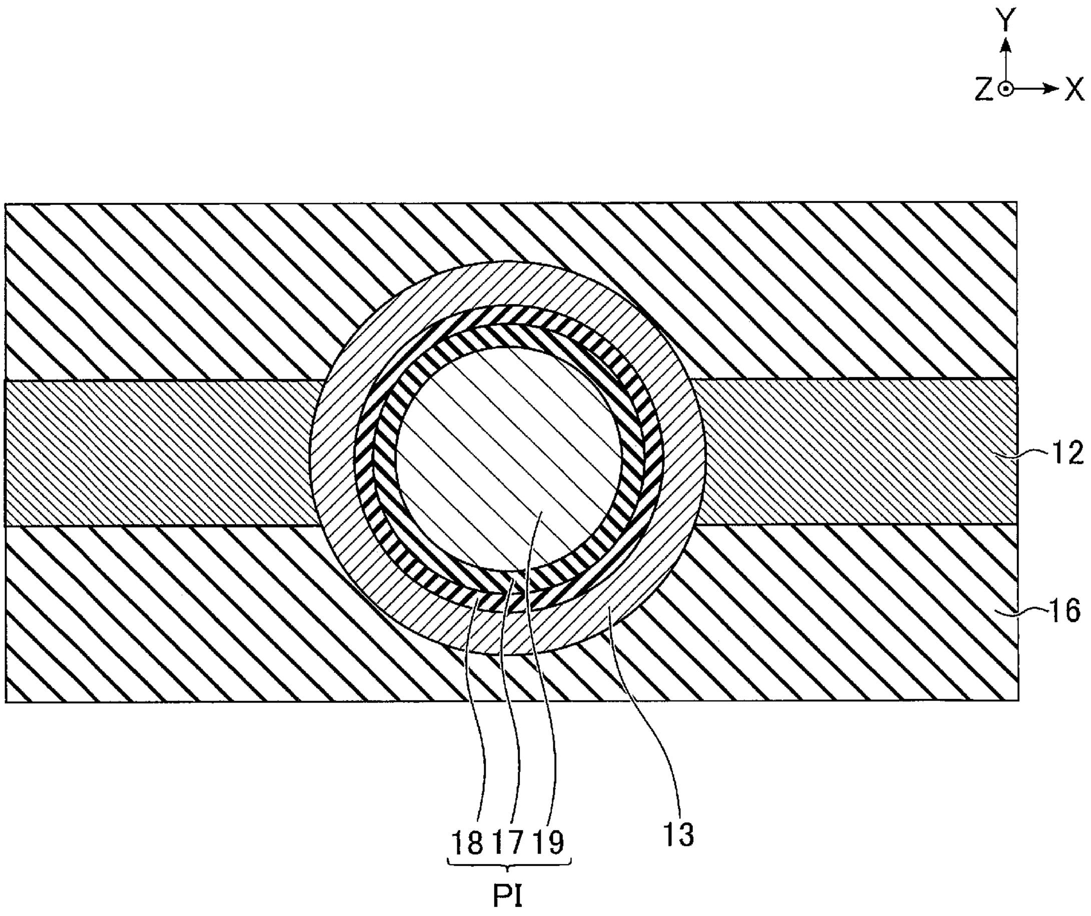
F I G. 19

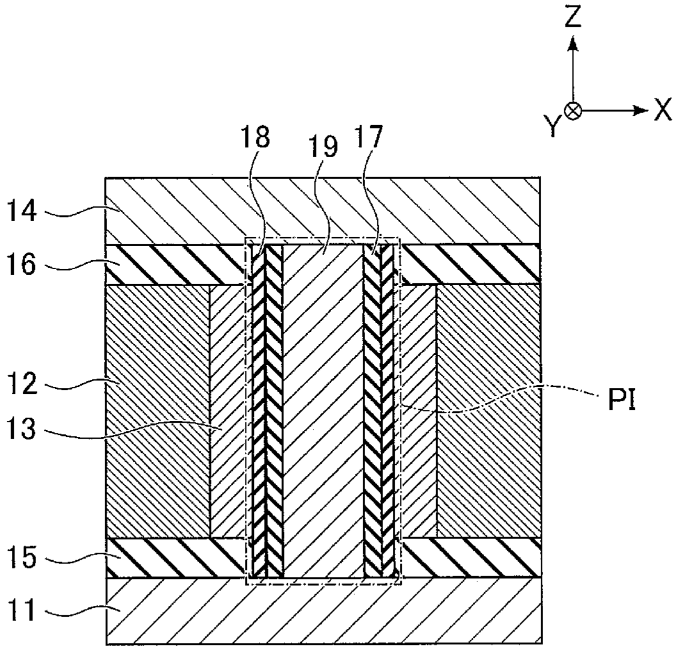
F I G. 20

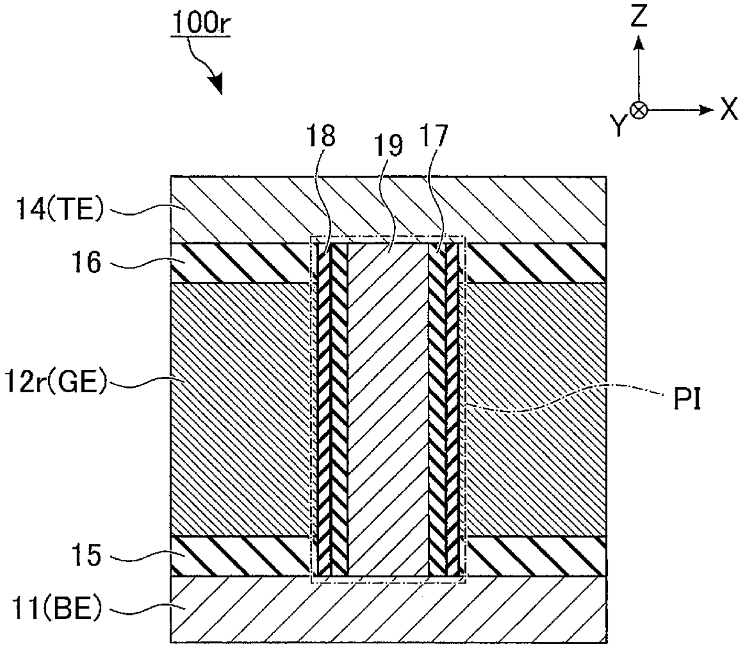
F I G. 21

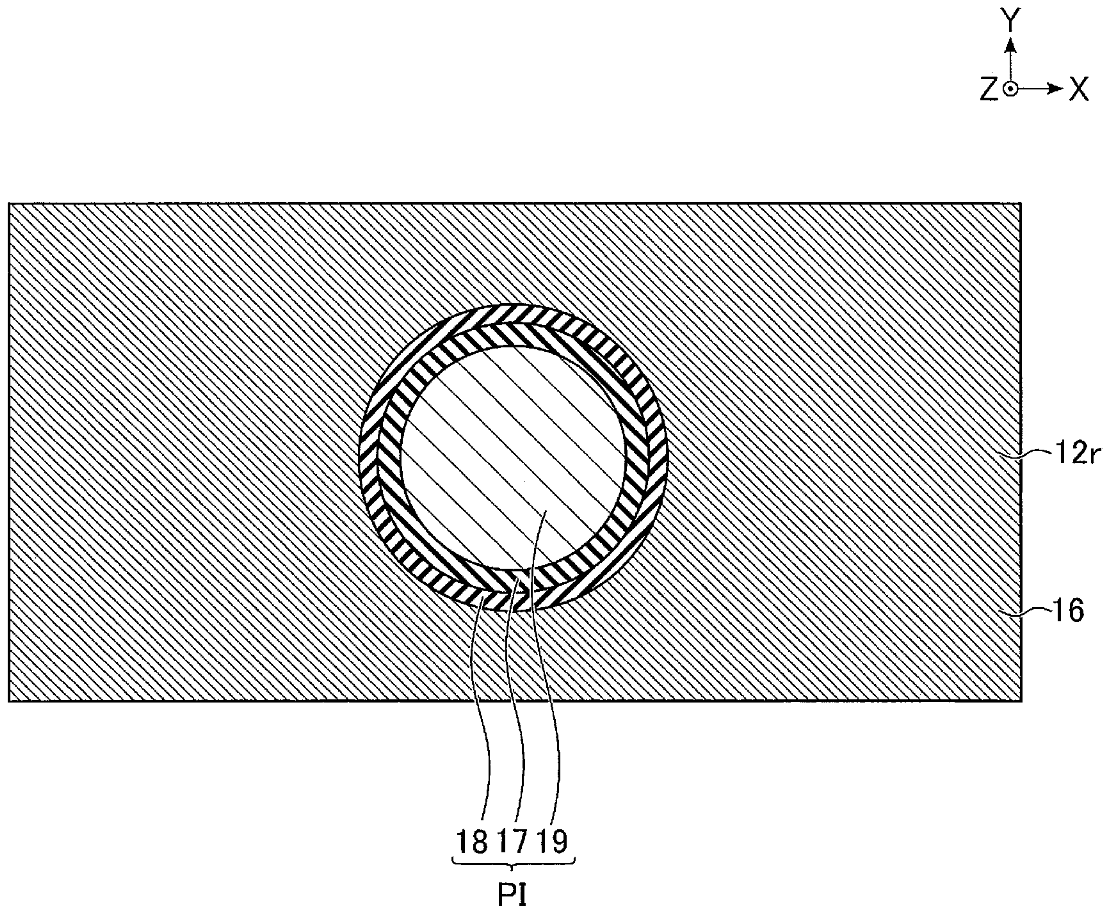
F I G. 22

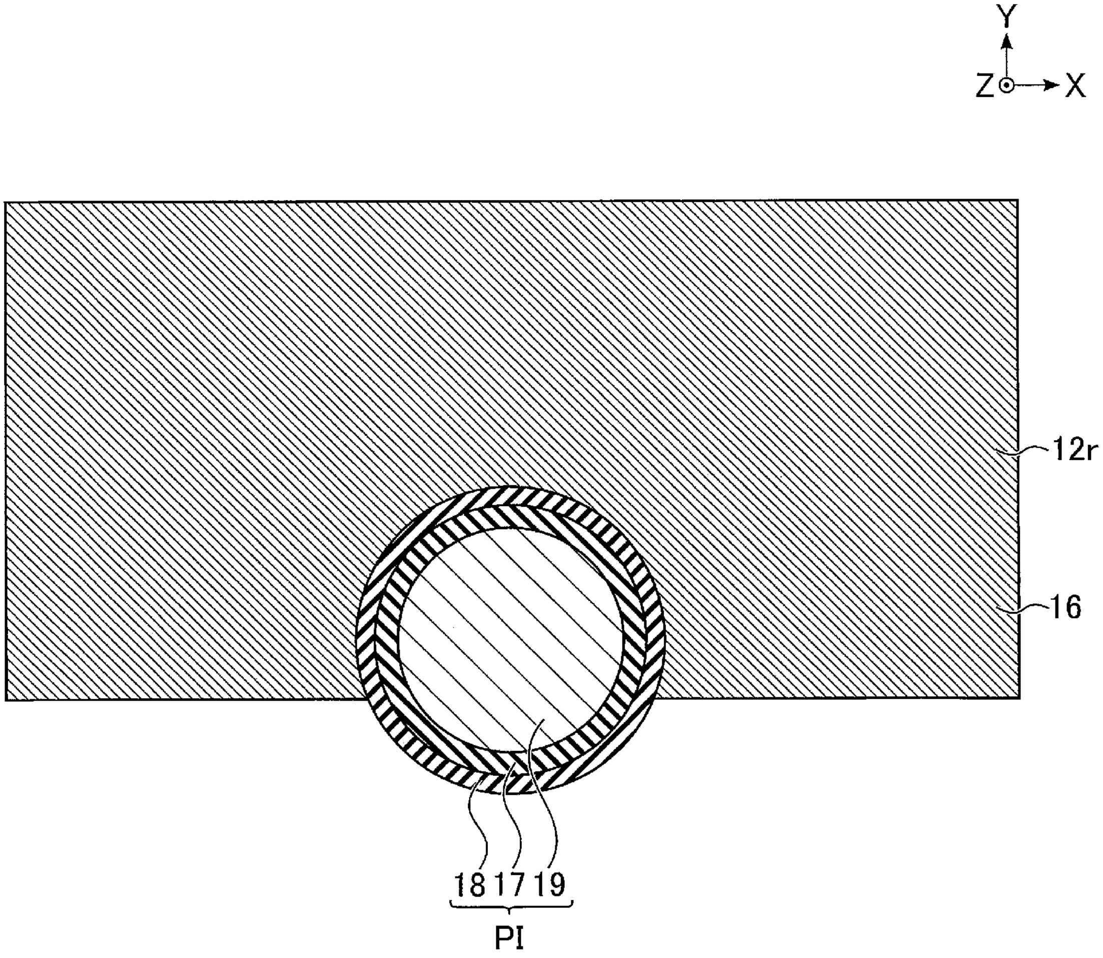
F I G. 23

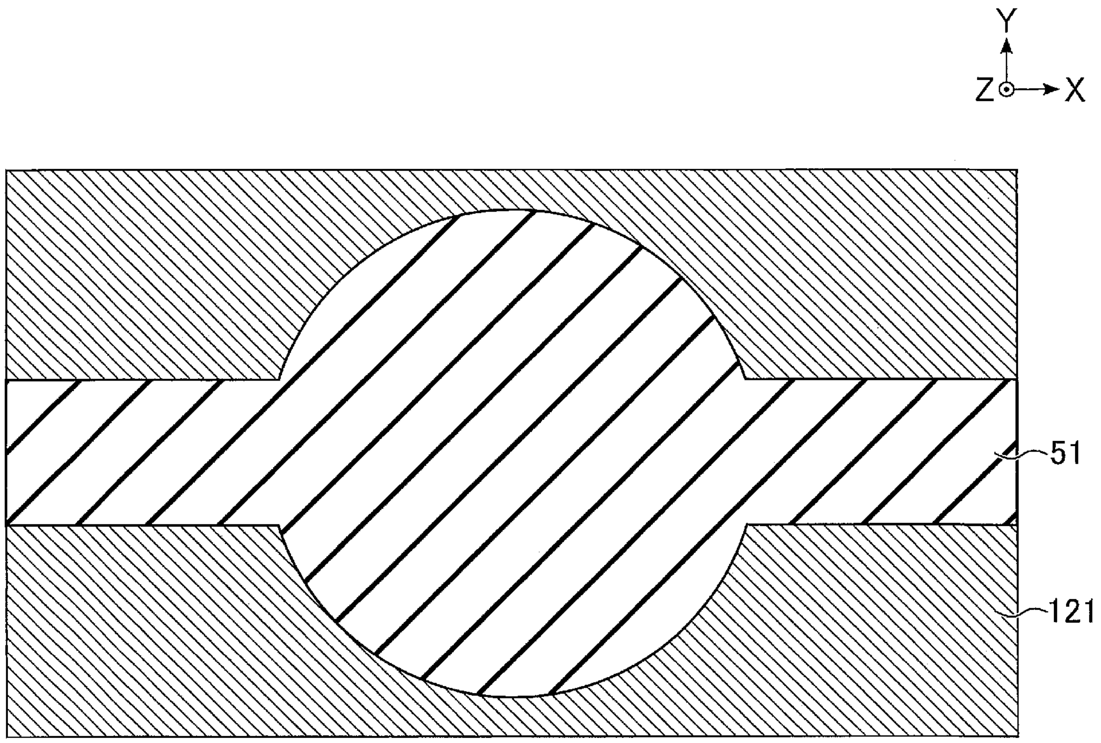
F I G. 25

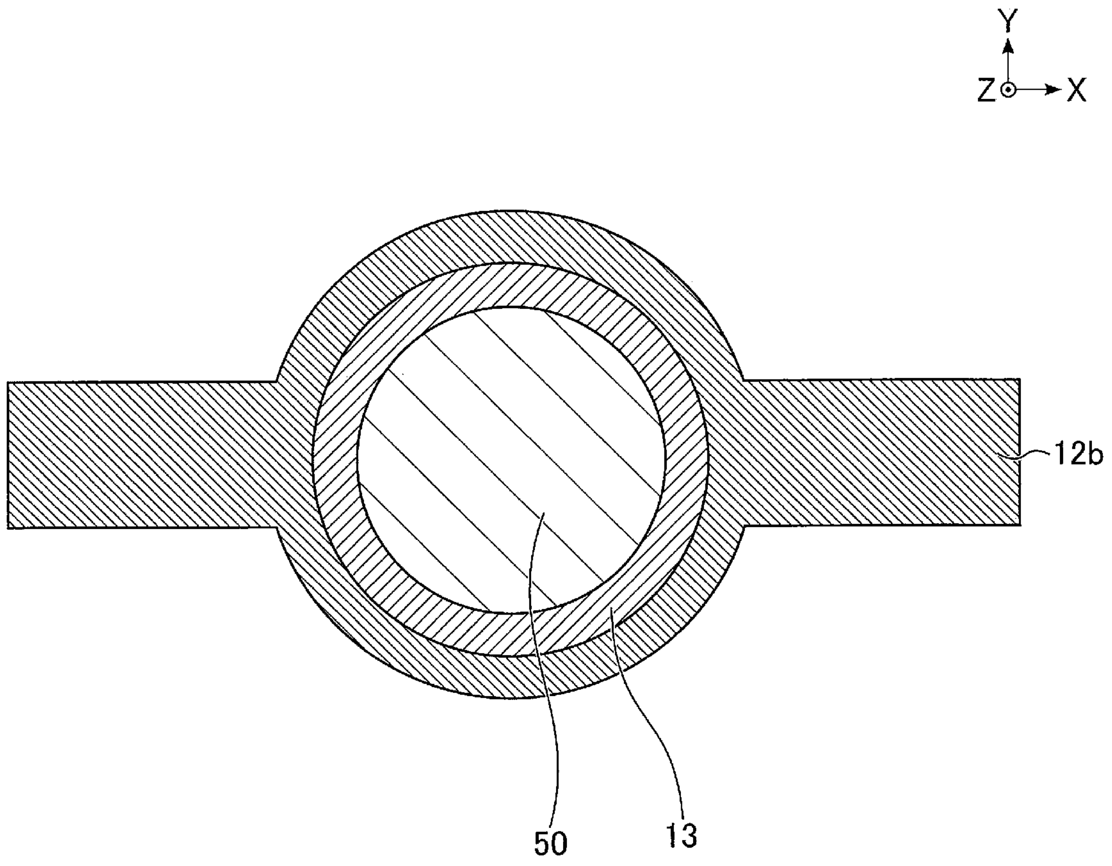
F I G. 26

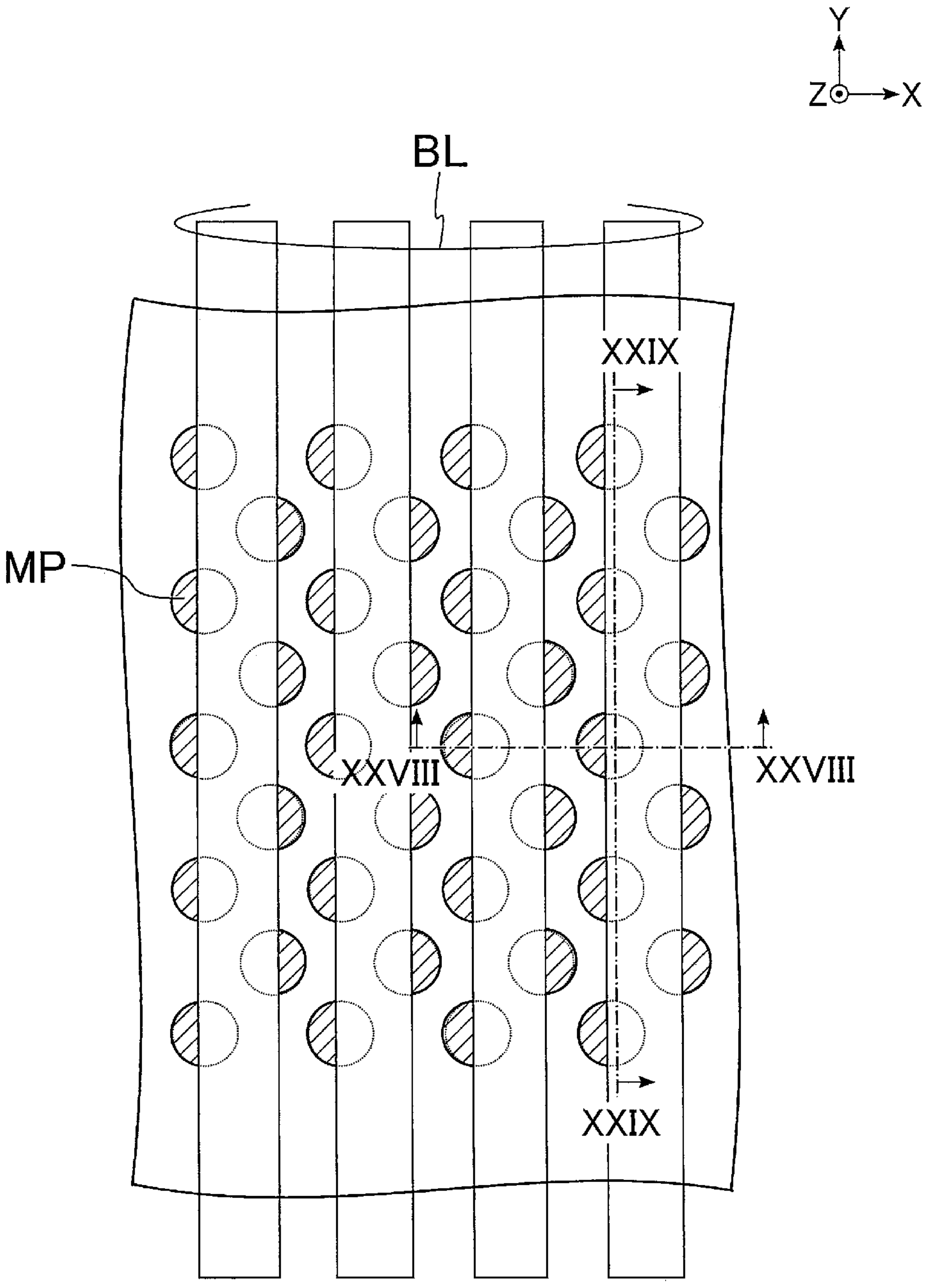
F I G. 27

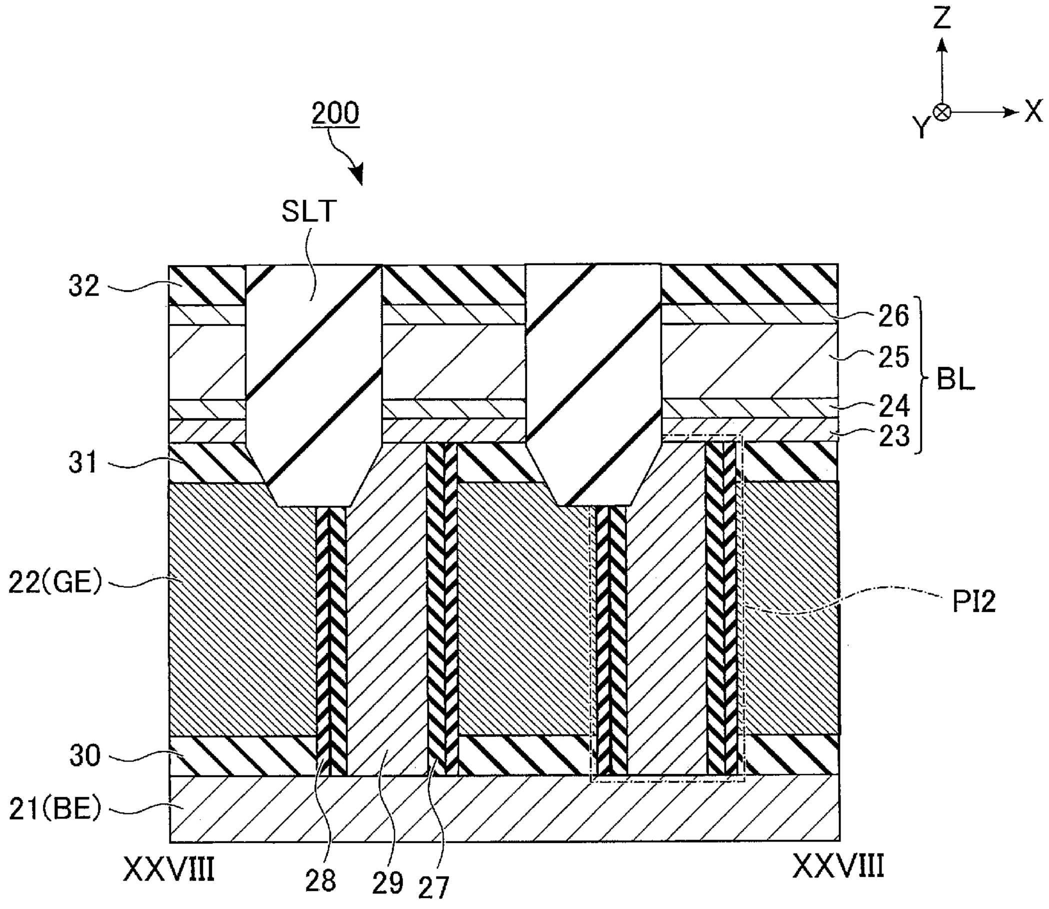
F I G. 28

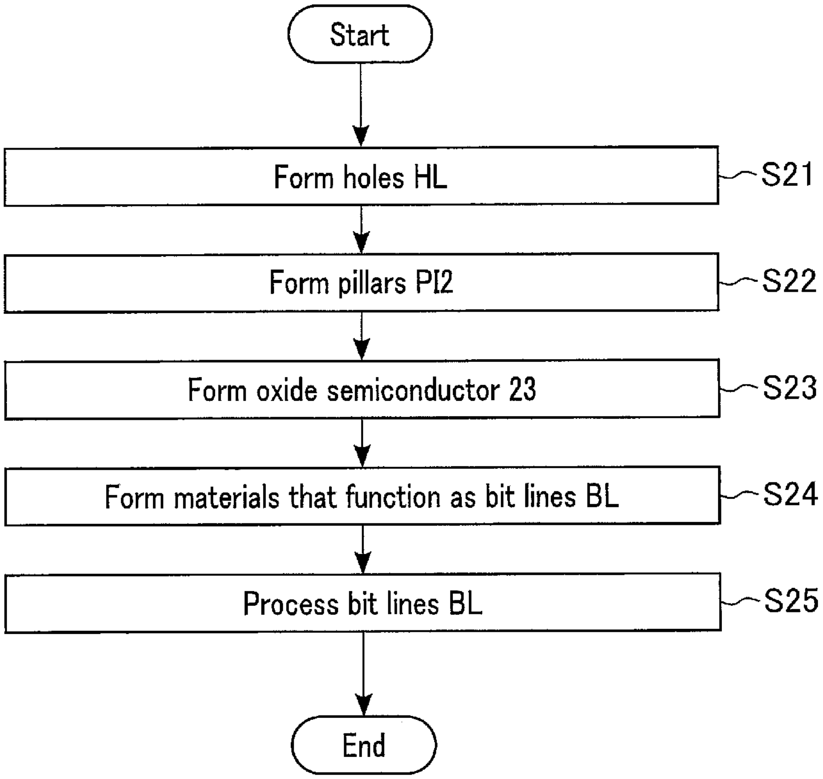
F I G. 30

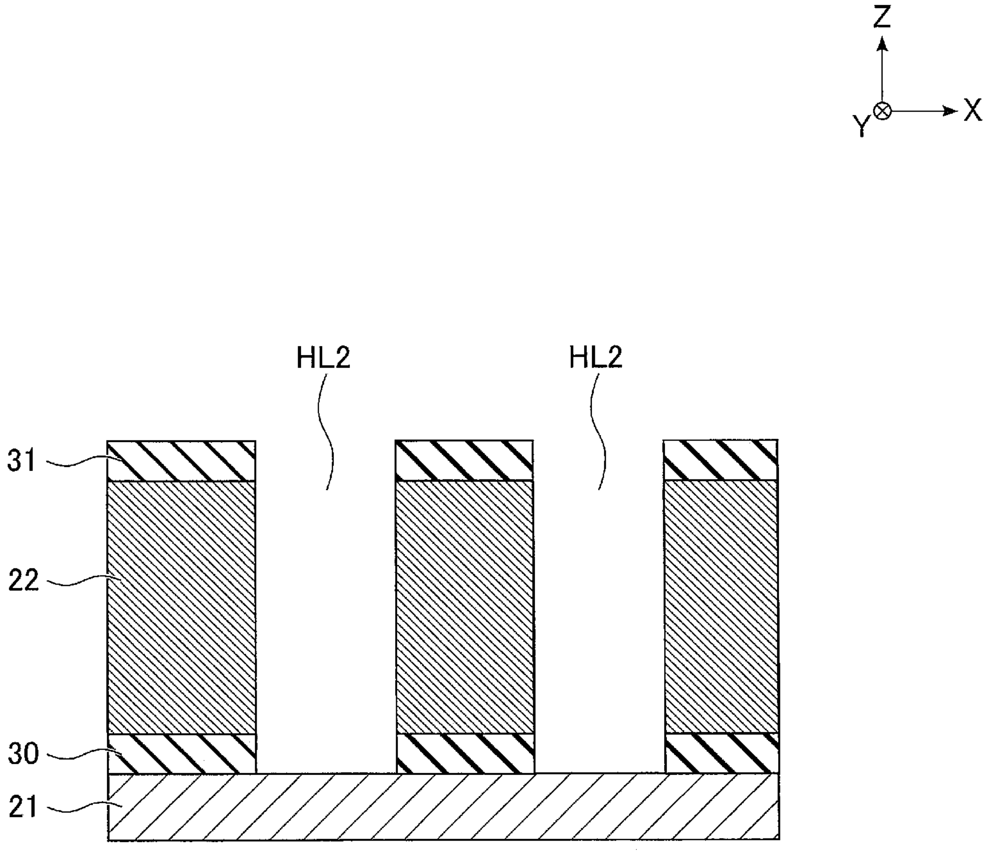
F I G. 31

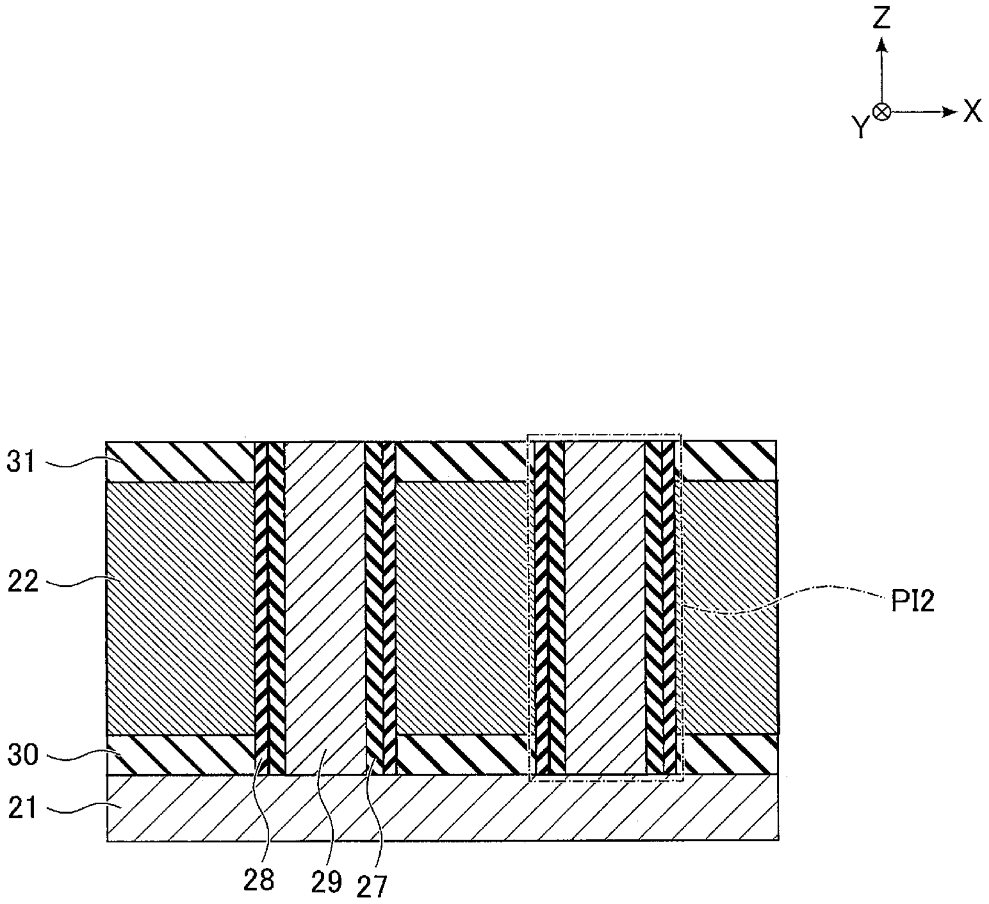
F I G. 32

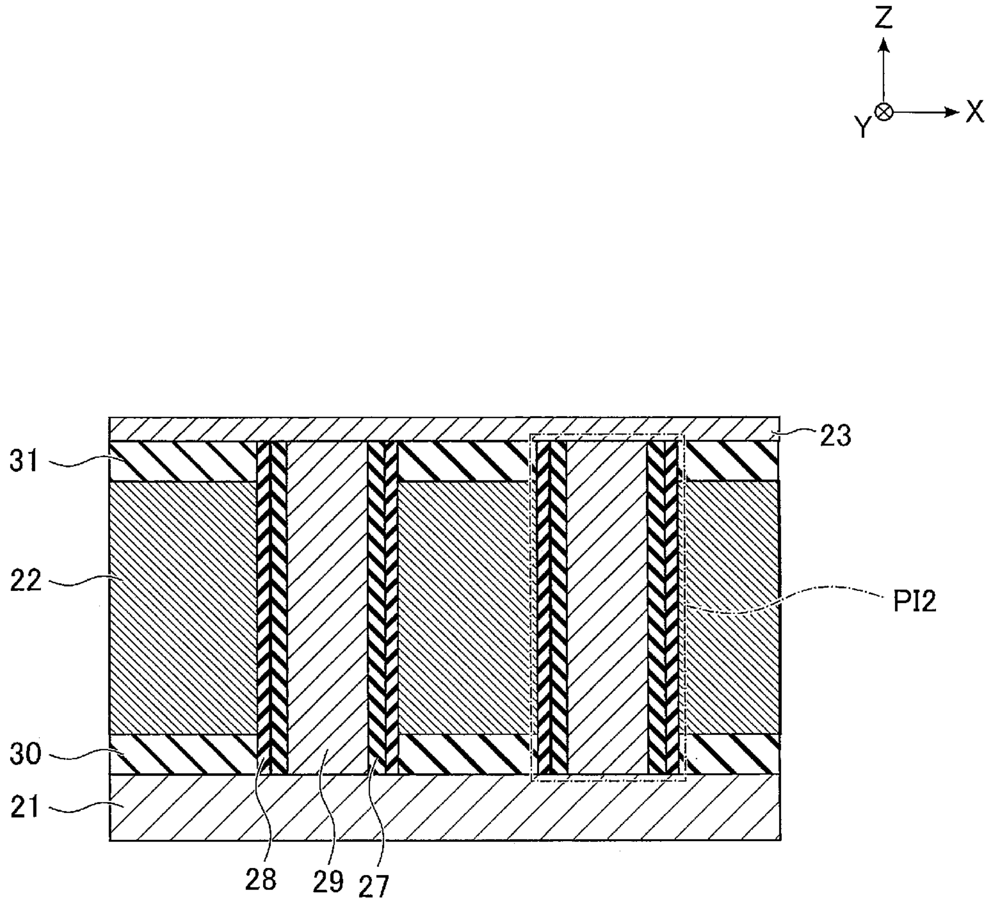
F I G. 33

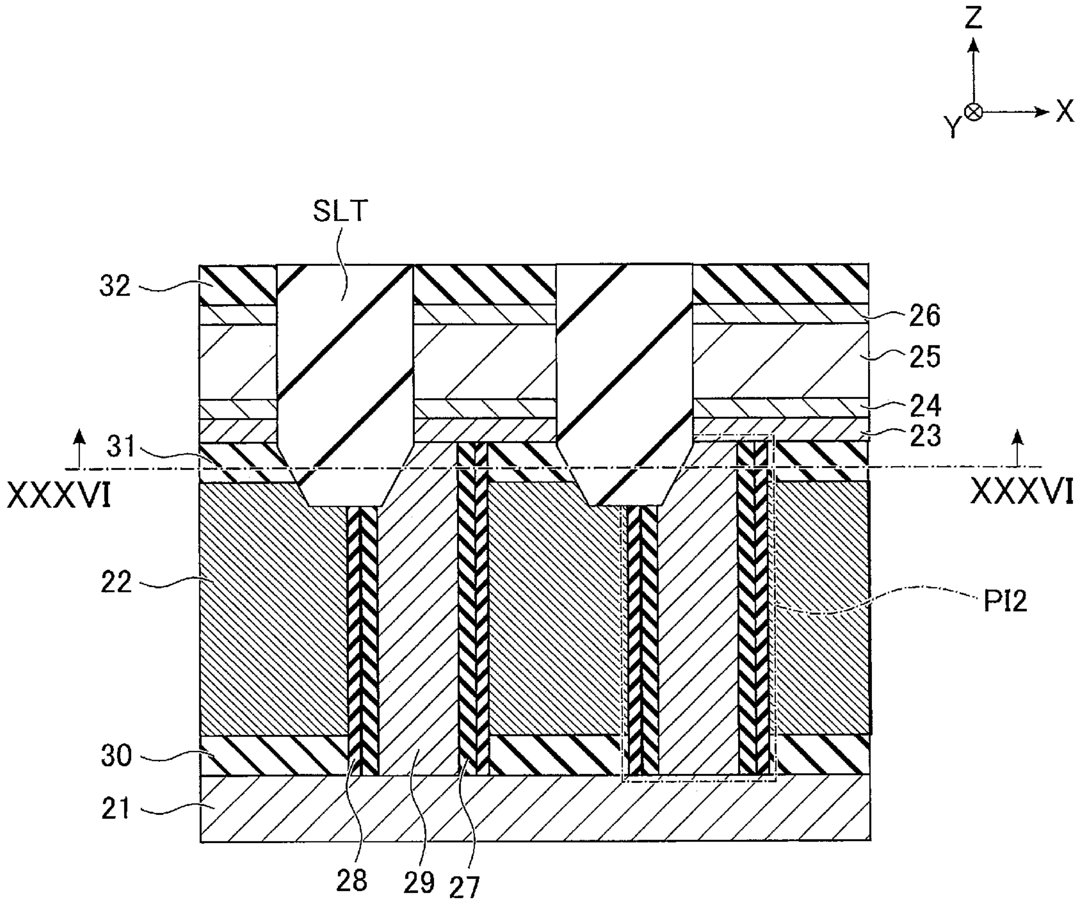
F I G. 35

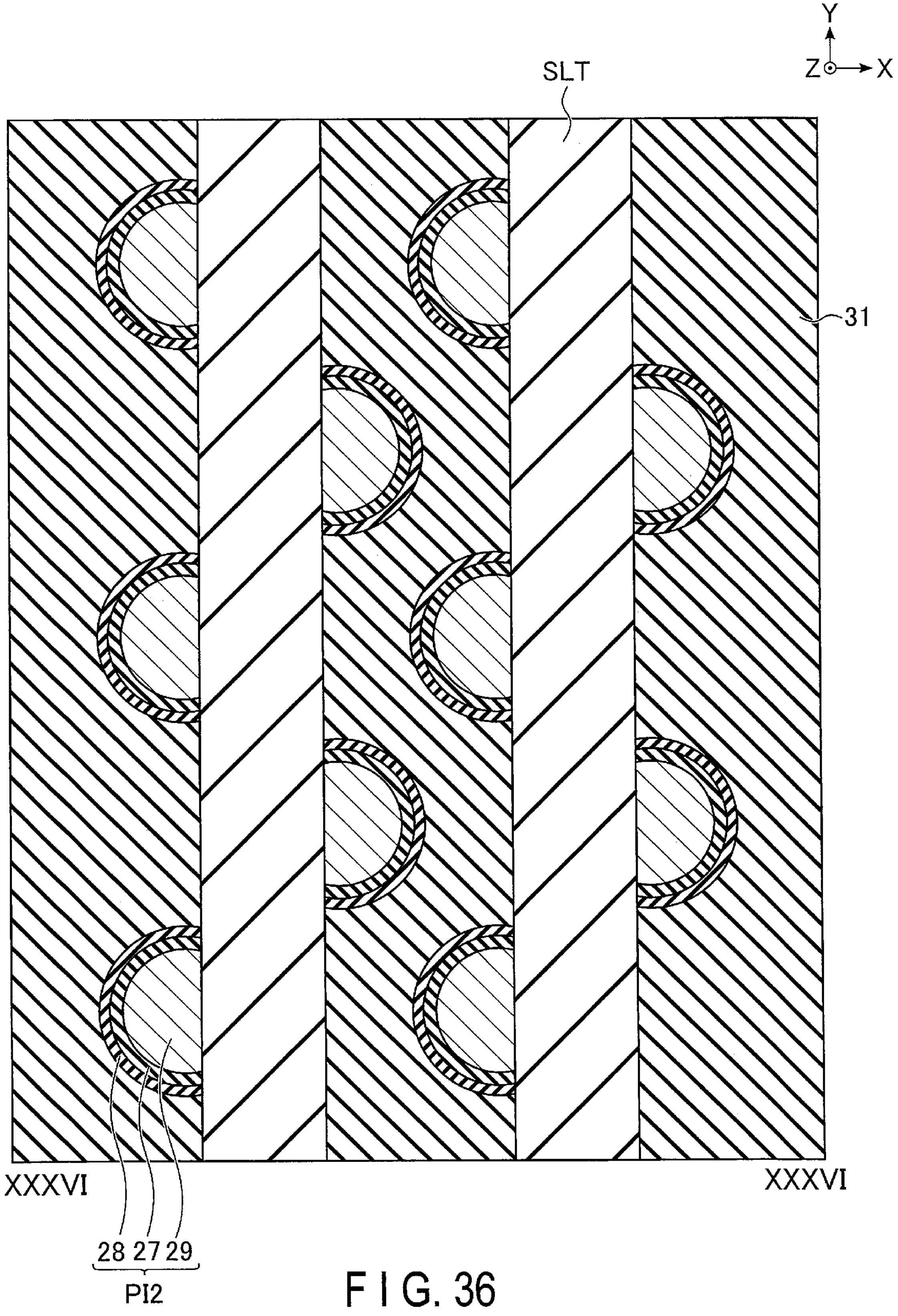
F I G. 36

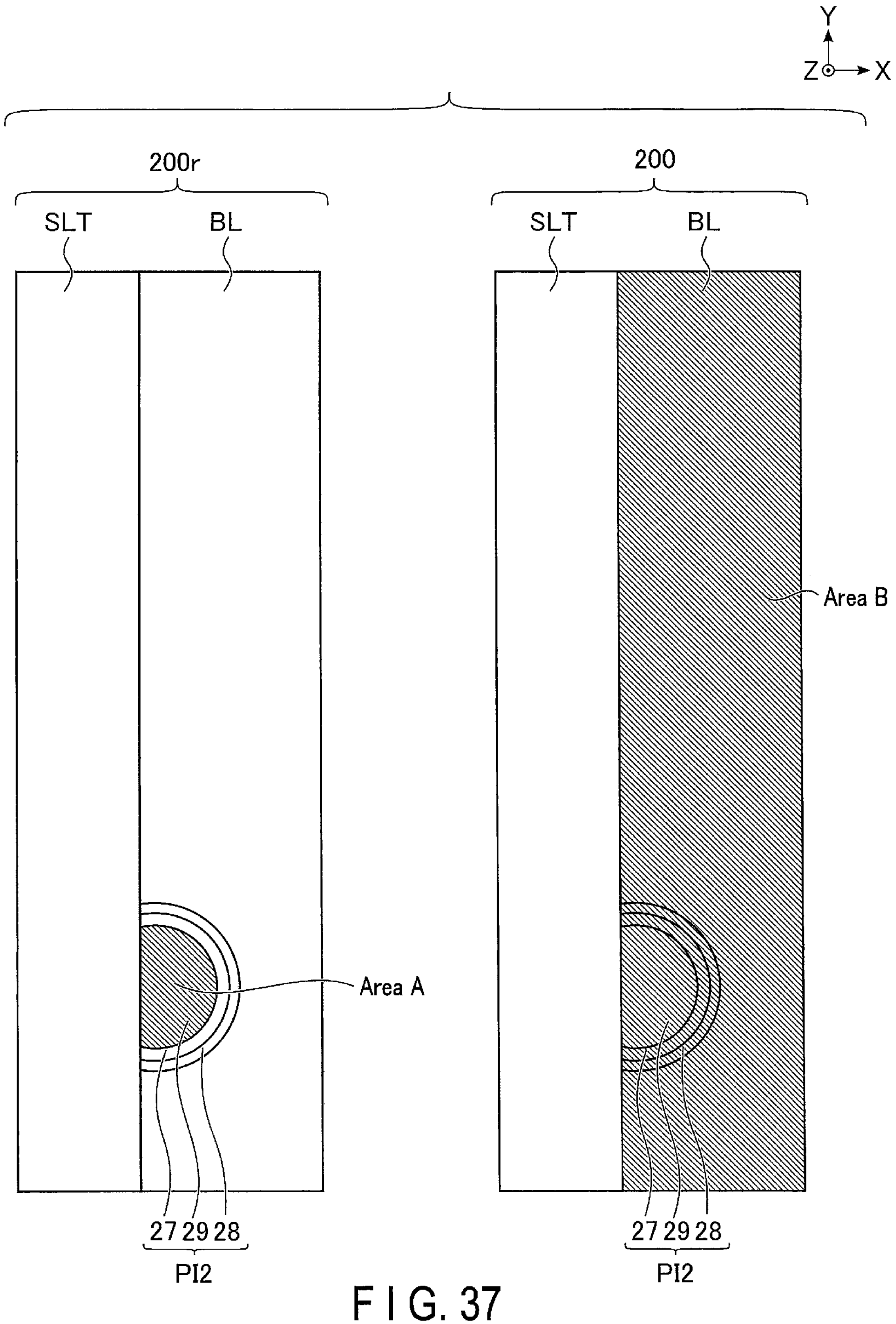
F I G. 37

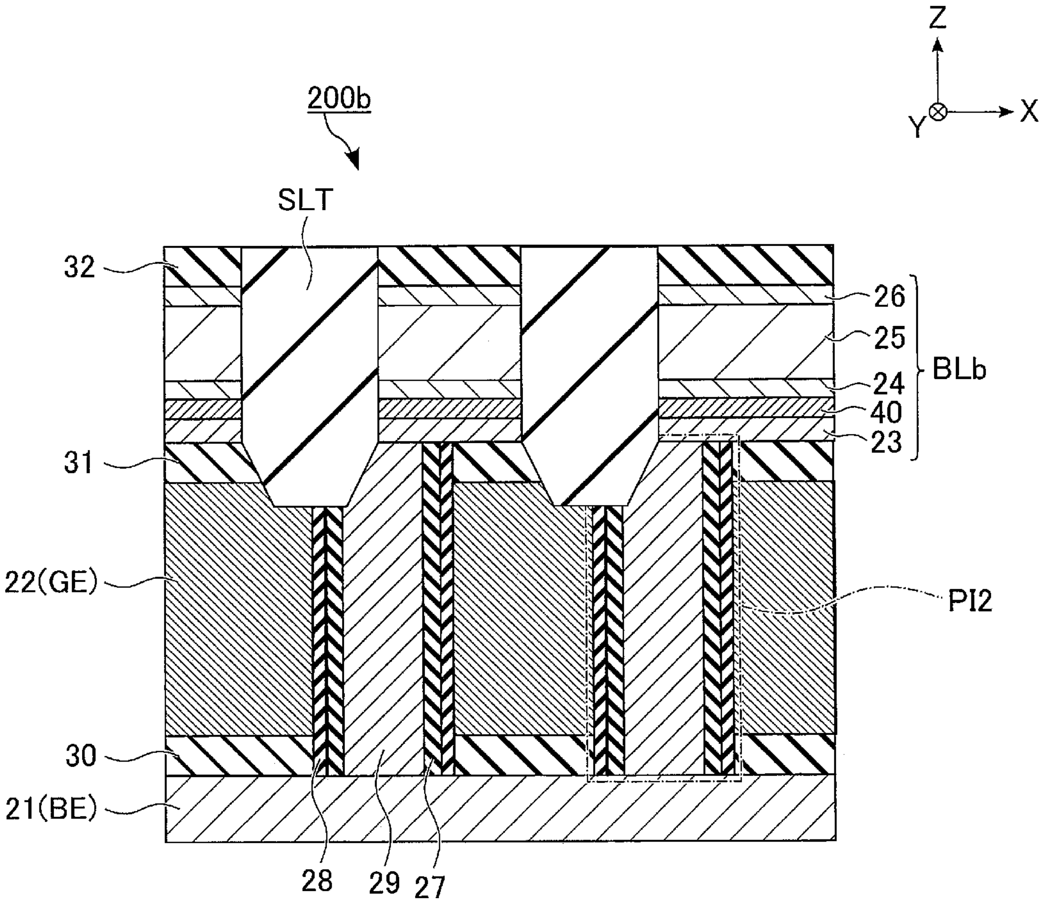
F I G. 38

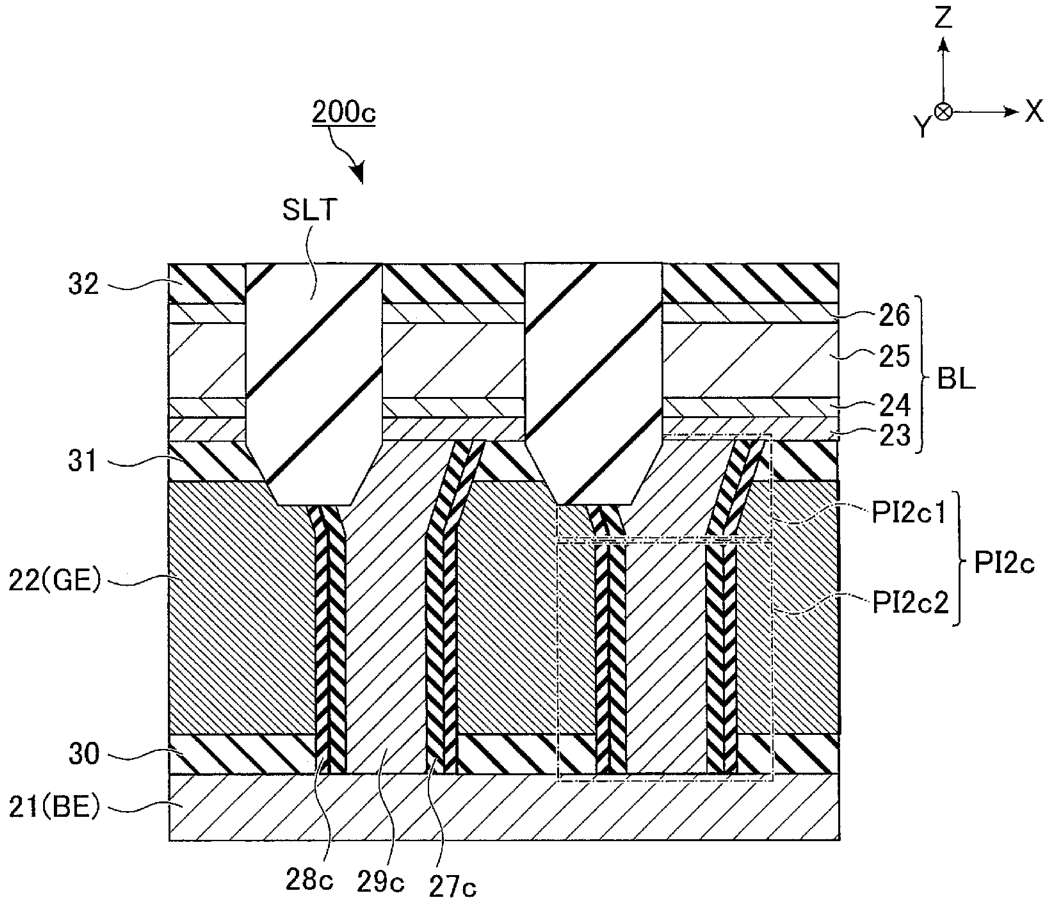
F I G. 39

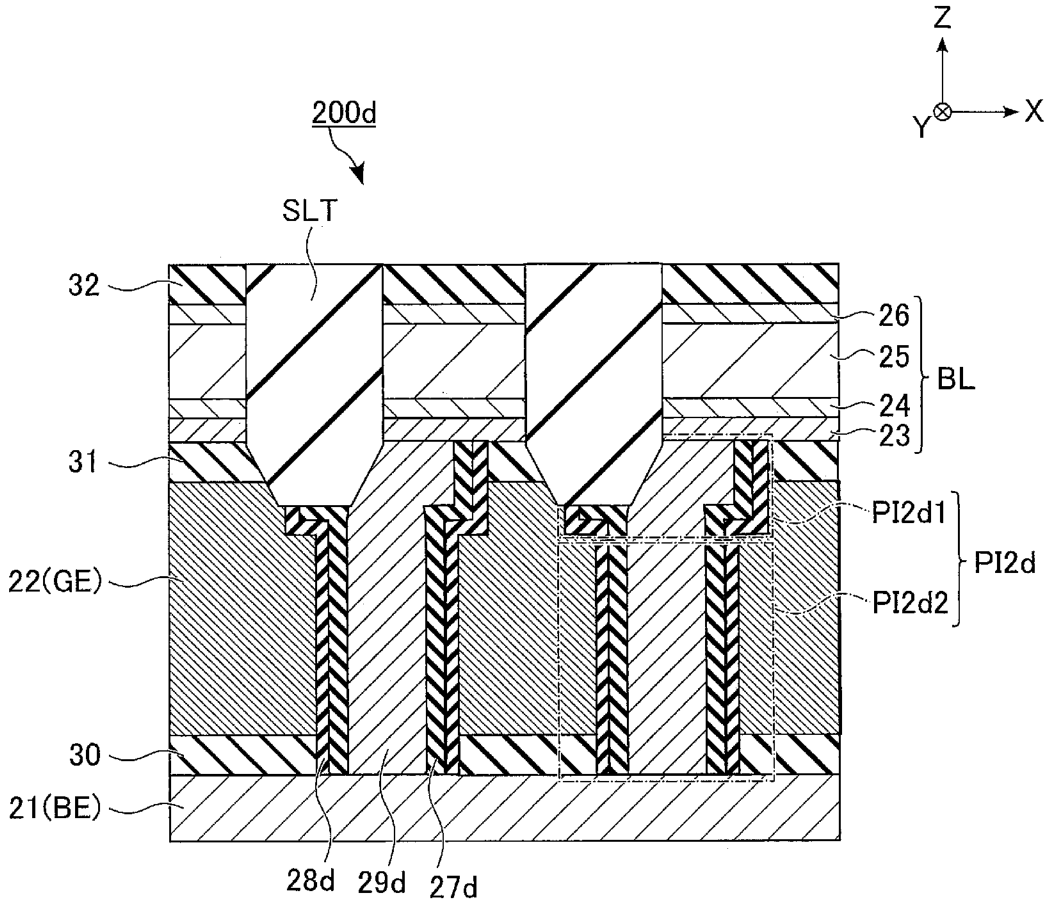
F I G. 40

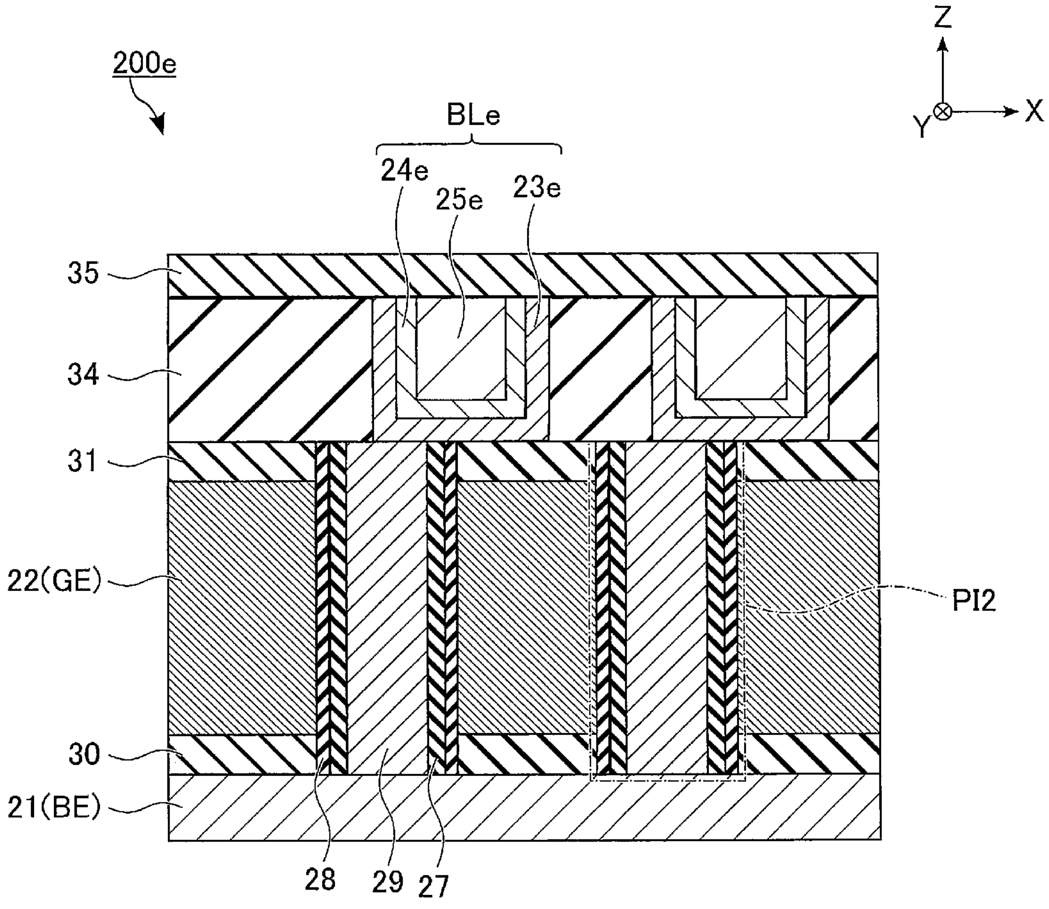
F I G. 41

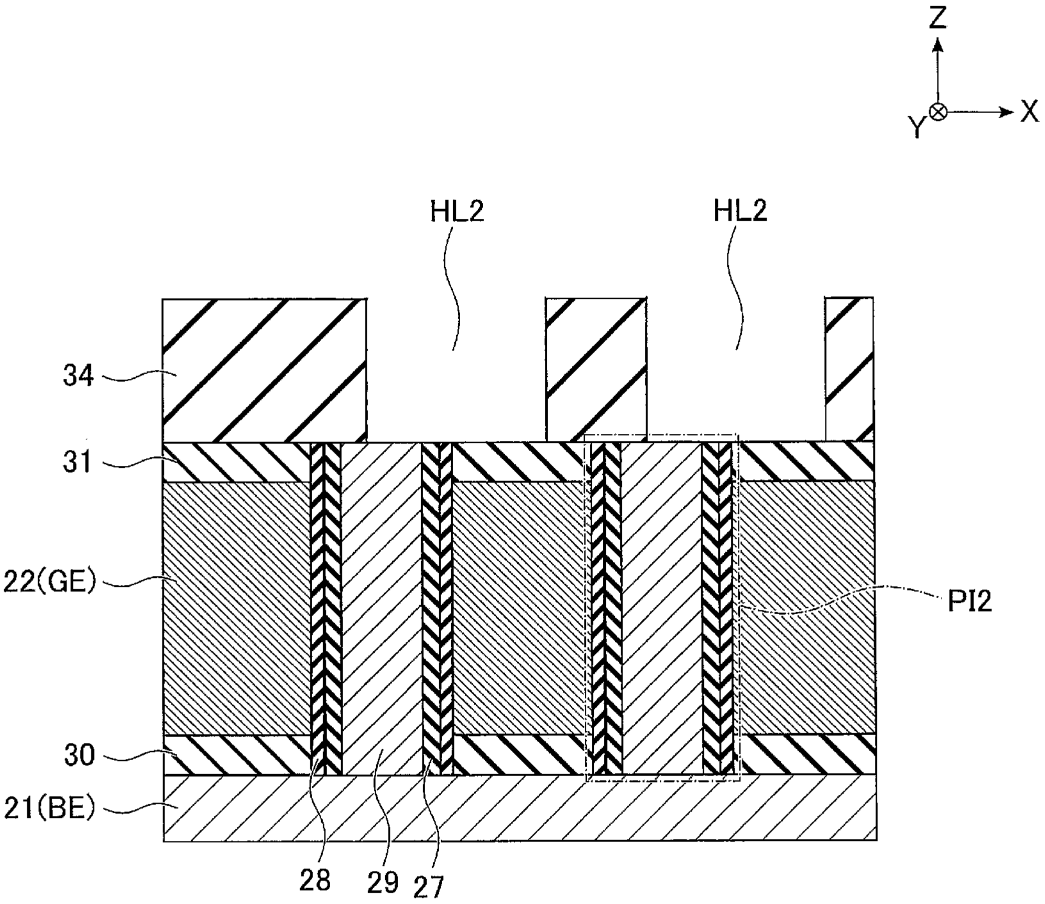
F I G. 42

SEMICONDUCTOR DEVICE AND METHOD OF MANUFACTURING THE SAME

CROSS-REFERENCE TO RELATED APPLICATIONS

This application is based upon and claims the benefit of priority from Japanese Patent Application No. 2022-094583, filed Jun. 10, 2022, the entire contents of which are incorporated herein by reference.

FIELD

Embodiments described herein relate generally to a semiconductor device and a method of manufacturing the same.

BACKGROUND

Semiconductor devices are used in various types of electronic equipment.

BRIEF DESCRIPTION OF THE DRAWINGS

FIG. 2 shows an example of a cross-sectional structure of the semiconductor device 100 according to the first embodiment.

FIG. 4 is a flowchart showing an example of steps of manufacturing the semiconductor device 100 according to the first embodiment.

FIG. 5 shows an example of a cross-sectional structure of the semiconductor device 100 during manufacturing according to the first embodiment.

FIG. 10 shows an example of a cross-sectional structure of the semiconductor device 100 during manufacturing according to the first embodiment.

FIG. 12 shows an example of a cross-sectional structure of the semiconductor device 100 during manufacturing according to the first embodiment.

FIG. 14 shows an example of a cross-sectional structure of the semiconductor device 100 during manufacturing according to the first embodiment.

FIG. 16 shows an example of a cross-sectional structure of the semiconductor device 100 during manufacturing according to the first embodiment.

FIG. 17 shows an example of a cross-sectional structure of the semiconductor device 100 during manufacturing according to the first embodiment.

FIG. 18 shows an example of a cross-sectional structure of the semiconductor device 100 during manufacturing according to the first embodiment.

FIG. 19 shows an example of a cross-sectional structure of the semiconductor device 100 during manufacturing according to the first embodiment.

FIG. 20 shows an example of a cross-sectional structure of the semiconductor device 100 during manufacturing according to the first embodiment.

FIG. 21 shows an example of a cross-sectional structure of a semiconductor device 100*r* according to a comparative example of the first embodiment.

FIG. 22 shows an example of a cross-sectional structure of a semiconductor device 100*r* according to a comparative example of the first embodiment.

FIG. 23 shows an example of a cross-sectional structure of a semiconductor device 100*r* according to a comparative example of the first embodiment.

FIG. 25 shows an example of a planar layout of the semiconductor device 100*b* during manufacturing according to the modification of the first embodiment.

FIG. 26 shows an example of a cross-sectional structure of the semiconductor device 100*b* during manufacturing according to the modification of the first embodiment.

FIG. 27 is a planar view showing an example of a planar layout of a semiconductor device 200 according to a second embodiment.

FIG. 28 is a cross-sectional view taken along line XXVIII-XXVIII of FIG. 27, showing an example of a cross-sectional structure of the semiconductor device 200 according to the second embodiment.

FIG. 30 is a flowchart showing an example of steps of manufacturing the semiconductor device 200 according to the second embodiment.

FIG. 31 shows an example of a cross-sectional structure of the semiconductor device 200 during manufacturing according to the second embodiment.

FIG. 32 shows an example of a cross-sectional structure of the semiconductor device 200 during manufacturing according to the second embodiment.

FIG. 33 shows an example of a cross-sectional structure of the semiconductor device 200 during manufacturing according to the second embodiment.

FIG. 35 shows an example of a cross-sectional structure of the semiconductor device 200 during manufacturing according to the second embodiment.

FIG. 36 is a cross-sectional view taken along line XXXVI-XXXVI of FIG. 35, showing an example of a cross-sectional structure during manufacturing of the semiconductor device 200 according to the second embodiment.

FIG. 37 shows planar views of a semiconductor device 200*r* according to a comparative example of the second embodiment and the semiconductor device 200 according to the second embodiment.

FIG. 38 shows an example of a cross-sectional structure of a semiconductor device 200*b* according to a first modification of the second embodiment.

FIG. 39 shows an example of a cross-sectional structure of a semiconductor device 200*c* according to a second modification of the second embodiment.

FIG. 40 shows an example of a cross-sectional structure of a semiconductor device 200*d* according to a third modification of the second embodiment.

FIG. 41 shows an example of a cross-sectional structure of a semiconductor device 200*e* according to a fourth modification of the second embodiment.

FIG. 42 shows an example of a cross-sectional structure of the semiconductor device 200*e* during manufacturing according to the fourth modification of the second embodiment.

DETAILED DESCRIPTION

Figure 1:
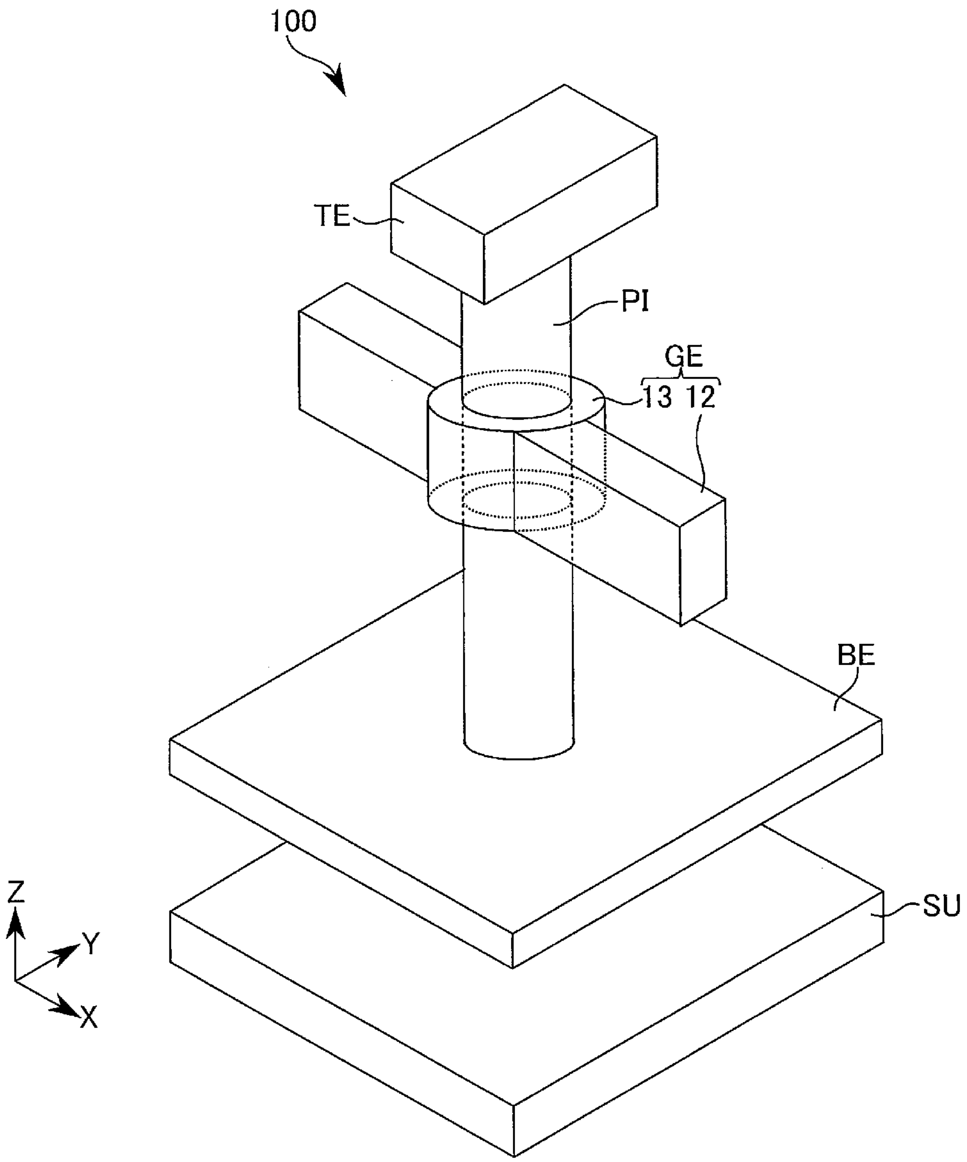
FIG. 1 is a perspective view showing a configuration example of a semiconductor device 100 according to a first embodiment.

A semiconductor device according to an embodiment includes a first conductor, a first oxide semiconductor, a first insulator, a second conductor, a third conductor, and a fourth conductor. The first oxide semiconductor contacts, at one end, the first conductor, and extends in a first direction intersecting a surface of the first conductor. The first insulator surrounds a side surface of the first oxide semiconductor. The second conductor and the first oxide semiconductor interpose the first insulator therebetween. The third conductor contacts another end of the first oxide semiconductor. The fourth conductor extends in a second direction intersecting the first direction, and contacts a second conductor on a side opposite to the first insulator. The second conductor is of a material with a higher work function than a material of the fourth conductor.

Hereinafter, embodiments will be described with reference to the accompanying drawings. In the following description, components with substantially the same functionalities and configurations will be referred to with the same reference symbols, and repeated descriptions may be omitted. In order to distinguish components with substantially the same functionalities and configurations from each other, an additional numeral or letter may be added to the end of each reference numeral.

The figures are schematic, and matters such as the relation between thicknesses and planar dimensions and the ratio of thicknesses of layers may differ from those in actuality. Accordingly, the concrete thicknesses, dimensions, etc. should be determined in view of the description to be given below. The figures may include components which differ in relations and/or ratios of dimensions in different figures. The entire description of a particular embodiment also applies to other embodiments unless explicitly mentioned otherwise or obviously excluded. The embodiments are shown as an example of a device or a method for embodying the technical idea of the embodiments, and the technical idea of the embodiments does not limit the material, shape, structure, arrangement, etc. of components to those described below. The expressions "practically identical", "substantially identical", and "substantially uniform" as used herein mean intended to be the same, but not completely identical, allowing for errors due to limitations in manufacturing technology and/or measuring technology.

<1> First Embodiment

Hereinafter, a semiconductor device 100 according to a first embodiment will be described.

<1-1> Configuration (Structure)

Hereinafter, an example of a structure of the semiconductor device 100 according to the first embodiment will be described. In the description that follows, an orthogonal coordinate system including an X axis, a Y axis, and a Z axis will be used. In the description that follows, the term "low" or "bottom" and its derivative and relevant terms refer to a position at a smaller coordinate on the Z axis, and the term "up" or "top" and its derivative and relevant terms refer to a position at a larger coordinate on the Z axis. In planar views, hatching is suitably applied for improved visibility. The hatching applied in the planar views does not necessarily relate to the material or characteristics of the hatched components. In the cross-sectional views, components such as insulating layers (interlayer insulating films), a substrate SU, interconnects, contacts, etc. are suitably omitted for improved visibility.

FIG. 1 is a perspective view showing a configuration example of the semiconductor device 100 according to the first embodiment. The semiconductor device 100 includes, as shown in FIG. 1, a substrate SU, a bottom electrode BE, a top electrode TE, a gate electrode GE, and a plurality of pillars PI. The bottom electrode BE is, for example, provided above the substrate SU. The top electrode TE is provided above the bottom electrode BE. The gate electrode GE is provided between the bottom electrode BE and the top electrode TE. Each pillar PI is, for example, provided in a pillar shape extending along the Z axis. A side surface of the pillar PI is in contact with the gate electrode GE. A lower end of the pillar PI is electrically connected to the bottom electrode BE, and an upper end of the pillar PI is electrically connected to the top electrode TE.

The semiconductor device 100 functions as a transistor. Each of the bottom electrode BE and the top electrode TE functions as a source electrode or a drain electrode of the semiconductor device 100. The gate electrode GE functions as a gate electrode of the semiconductor device 100. The pillar PI functions as a current path (channel) of the semiconductor device 100. With the above-described configuration, the semiconductor device 100, in which a current flows between the bottom electrode BE and the top electrode TE through the pillar PI extending along the Z axis, may be referred to as a "vertical transistor".

FIG. 2 shows an example of a cross-sectional structure of the semiconductor device 100 according to the first embodiment. The semiconductor device 100 includes, as shown in FIG. 2, a plurality of conductors 11-14, a plurality of insulators 15 and 16, and a plurality of pillars PI. The conductor 11 functions as the bottom electrode BE. The conductors 12 and 13 function as the gate electrode GE. The conductor 14 functions as the top electrode TE.

The insulator 15 is provided on the conductor 11. The gate electrode GE (conductors 12 and 13) is provided on the insulator 15. Details of the conductors 12 and 13 will be described later. The insulator 16 is provided on the gate electrode GE. The conductor 14 is provided on the insulator 16. Each of the conductors 11 and 14 contains, for example, copper (Cu) or tungsten (W). Each of the insulators 15 and 16 contains, for example, a silicon oxide ($SiO_2$).

The pillars PI are provided between the conductor 11 and the conductor 14. Each pillar PI includes a first gate insulating film 17, a second gate insulating film 18, and an oxide semiconductor 19.

The oxide semiconductor 19 extends along the Z axis, and is provided at a central part of the pillar PI. The oxide semiconductor 19 is formed in, for example, a cylindrical shape. A lower end of the oxide semiconductor 19 is in contact with the conductor 11. An upper end of the oxide semiconductor 19 is in contact with the conductor 14. The oxide semiconductor 19 contains, for example, an indium oxide, a gallium oxide, and a zinc oxide. For the oxide semiconductor 19, an oxide containing at least one of indium, zinc, and tin (e.g., InO, InZnO, InSnO, SnO, ZnO, and ZnSnO) may be used.

The first gate insulating film 17 covers, for example, the periphery of the oxide semiconductor 19. The first gate insulating film 17 is provided, for example, in a cylindrical shape in the pillar PI. The first gate insulating film 17 contains, for example, an insulator such as silicon oxide.

The second gate insulating film 18 covers, for example, the periphery of the first gate insulating film 17. The second gate insulating film 18 is provided, for example, in a cylindrical shape in the pillar PI. The second gate insulating film 18 contains, for example, an insulator such as silicon nitride (SiN). The second gate insulating film 18 may be provided with a smaller thickness than the first gate insulating film 17. The second gate insulating film 18 may not be provided, depending on the design.

As described above, the gate electrode GE includes conductors 12 and 13. The conductor 13 covers the periphery of the second gate insulating film 18, except for a portion at which the insulators 15 and 16 and the second gate insulating film 18 are in contact with each other. In other words, the conductor 13 covers, for example, the periphery of the second gate insulating film 18 in a layer between the insulator 15 and the insulator 16. The conductor 13 is provided in, for example, a cylindrical shape in the periphery of the pillar PI. The conductor 13 may be referred to, for example, as a "first gate electrode".

The conductor 12 contacts the conductor 13 in, for example, a layer between the insulator 15 and the insulator 16. The conductor 12 extends, for example, along the X axis. The conductor 12 may be referred to, for example, as a "second gate electrode".

Here, the conductor 13 contains, for example, a material with a higher work function than the conductor 12. The conductor 13 contains, for example, Mo, Ni, Cu, Co, Se, TaC, Pd, Au, Ir, Pt, Re, $RuO_2$, InSnO, SbSnO, WO, RhO, OsO, IrO, SrRuO, LaRhO, SrMoO, LaTiO, p-type Si, or p-type Ge. The conductor 13 has a work function higher than, for example, 4.8 eV.

The conductor 12 contains, for example, a material with a higher electrical conductivity than the conductor 13. The conductor 12 contains, for example, W, Cu, Mo, Ru, Rh, Co, AlCu, NiAl, or RuAl.

Figure 3:
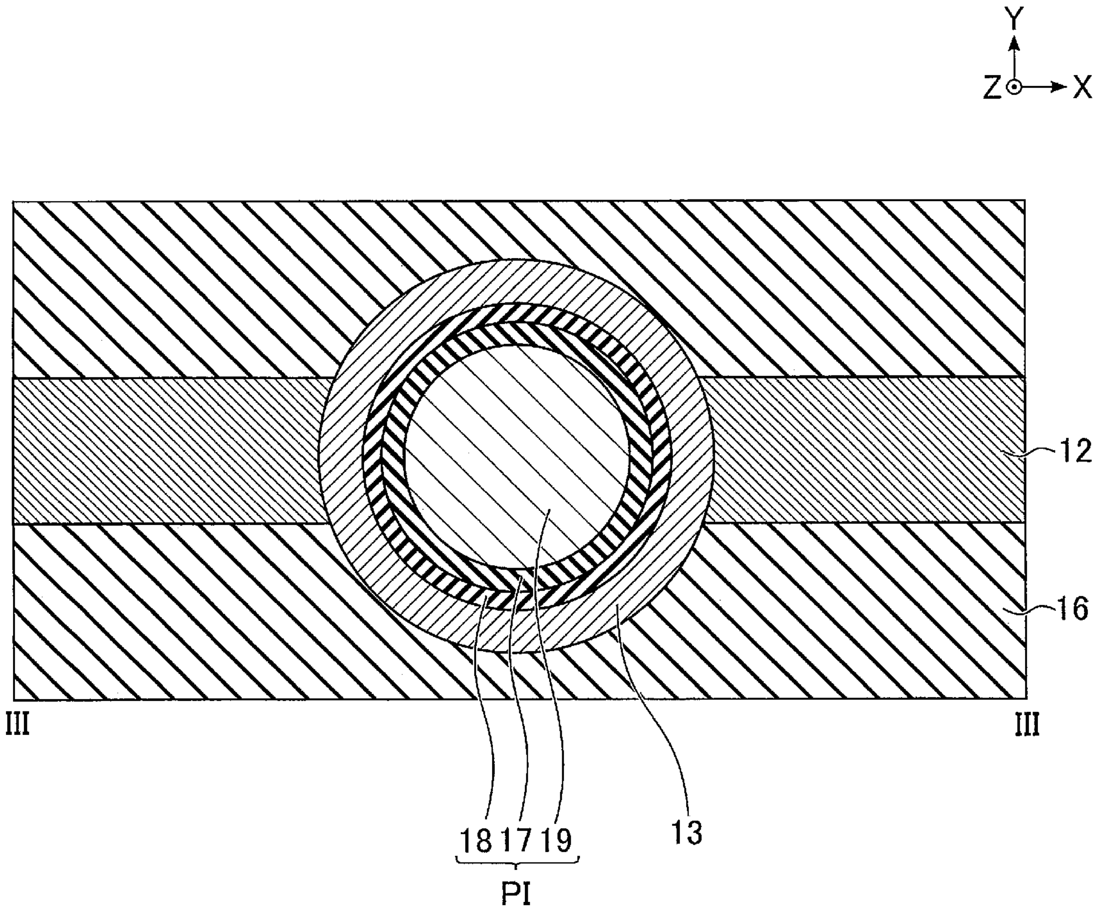
FIG. 3 is a cross-sectional view taken along line III-III of FIG. 2, showing an example of a cross-sectional structure of the semiconductor device 100 according to the first embodiment.

FIG. 3 is a cross-sectional view taken along line III-III of FIG. 2, showing an example of a cross-sectional structure of the semiconductor device 100 according to the first embodiment. More specifically, FIG. 3 shows a cross-sectional structure of the semiconductor device 100 in a layer parallel to a surface of the substrate SU and including the gate electrode GE. As shown in FIG. 3, in a cross section including the gate electrode GE, the oxide semiconductor 19 is provided at a central part of the pillar PI. The first gate insulating film 17 surrounds a side surface of the oxide semiconductor 19. In other words, the oxide semiconductor 19 is, for example, buried inside the first gate insulating film 17 provided in a cylindrical shape. The second gate insulating film 18 surrounds a side surface of the first gate insulating film 17.

The conductor 13 surrounds a side surface of the second gate insulating film 18. In other words, in an XY planar view from a +Z side (top view), the conductor 13 surrounds the side surface of the second gate insulating film 18. As described above, the conductor 12 extends along the X axis, and contacts the conductor 13.

In this manner, insulation is provided between the oxide semiconductor 19 and the conductors 12 and 13, which function as a gate electrode, by the first gate insulating film 17 and the second gate insulating film 18.

In each of the pillars PI described above, the oxide semiconductor 19 is used as a channel (current path) of the semiconductor device 100.

As shown in FIGS. 2 and 3, on the insulator 15, there are both a region in which the gate electrode GE (i.e., the conductors 12 and 13) is provided and a region in which it is not provided. In the region on the insulator 15 in which the gate electrode GE is not provided, an insulator 16 is provided. A top surface of the region of the insulator 16 including the gate electrode GE and a top surface of the region of the insulator 16 not including the gate electrode GE, for example, are at the same height. That is, the region of the insulator 16 including the gate electrode GE and the region of the insulator 16 not including the gate electrode GE have different thicknesses.

<1-2> Method of Manufacturing Semiconductor Device 100

FIG. 4 is a flowchart showing an example of steps of manufacturing the semiconductor device 100 according to the first embodiment. Each of FIGS. 5 to 20 shows an example of a cross-sectional structure during manufacturing of the semiconductor device 100 according to the first embodiment. Each of FIGS. 5, 6, 8, 10, 12, 14, 16, 18, and 20 shows a cross-section of a region identical to the region shown in FIG. 2. Each of FIGS. 7, 9, 11, 15, 17, and 19 shows a cross-section of a region identical to the region shown in FIG. 3. Hereinafter, an example of manufacturing steps relating to formation of the semiconductor device 100 according to the first embodiment will be described by suitably referring to FIG. 4. As shown in FIG. 4, a method of manufacturing the semiconductor device 100 according to the first embodiment includes, for example, steps S11 to S19 performed sequentially.

In step S11, a conductor 121 is formed, as shown in FIG. 5. Specifically, first, a conductor 11, which functions as a bottom electrode BE, is formed above a substrate SU (not illustrated). The conductor 11 is formed using, for example, sputtering.

Subsequently, an insulator 15, a conductor 121, and an insulator 161 are sequentially formed on the conductor 11. The conductor 121 is formed using, for example, sputtering. The insulator 161 is formed, for example, in a region including a region in which an insulator 16 is to be formed. Through performance of the subsequent processing, a conductor 12 is formed from a portion of the conductor 121. That is, the conductor 12 is formed by etching the conductor 121.

Figure 6:
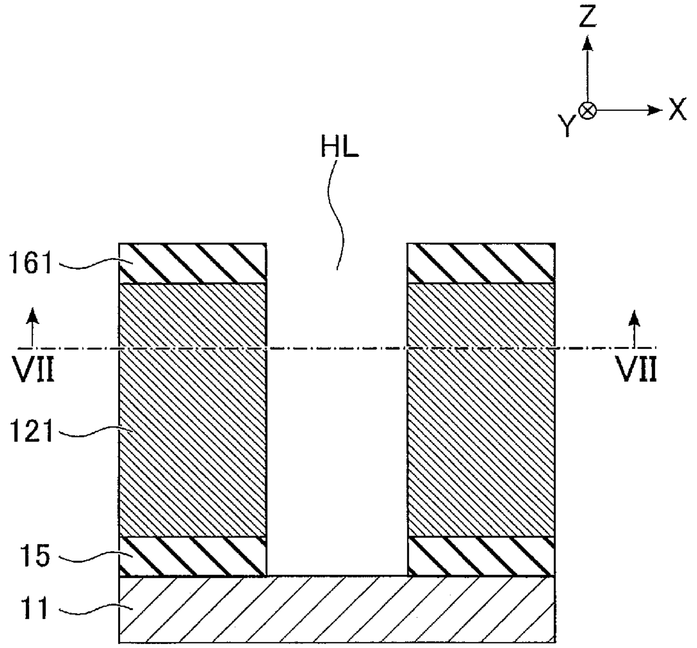
FIG. 6 shows an example of a cross-sectional structure of the semiconductor device 100 during manufacturing according to the first embodiment.
Figure 7:
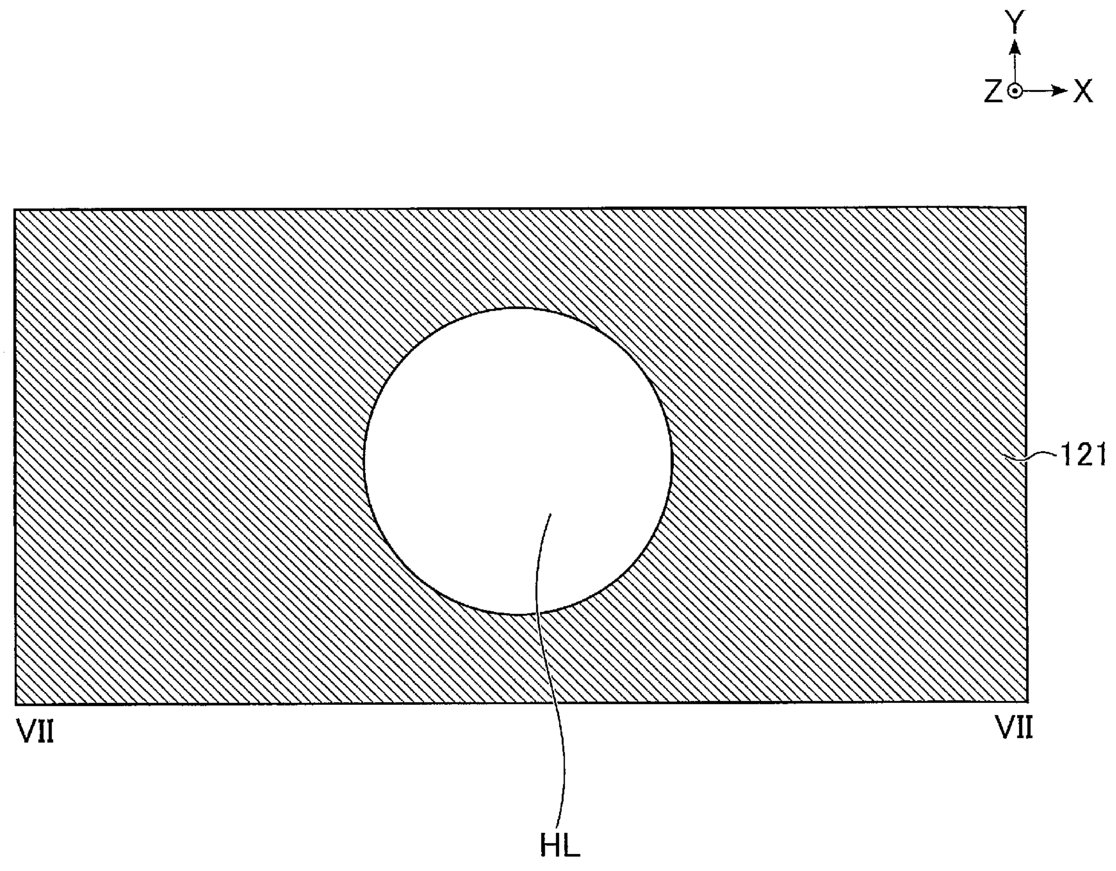
FIG. 7 is a cross-sectional view taken along line VII-VII of FIG. 6, showing an example of a cross-sectional structure during manufacturing of the semiconductor device 100 according to the first embodiment.

In step S12, as shown in FIGS. 6 and 7, a plurality of holes HL are formed in regions in which a plurality of pillars PI are respectively to be formed. FIG. 7 shows a cross-sectional structure of a layer including the conductor 121 in the semiconductor device 100 shown in FIG. 6, as viewed from the +Z side in the Z axis. Each hole HL is formed by, for example, photolithography and anisotropic etching, to reach a top surface of the conductor 11 from a top surface of the insulator 161. For the anisotropic etching, reactive ion etching (RIE), for example, is employed.

Figure 8:
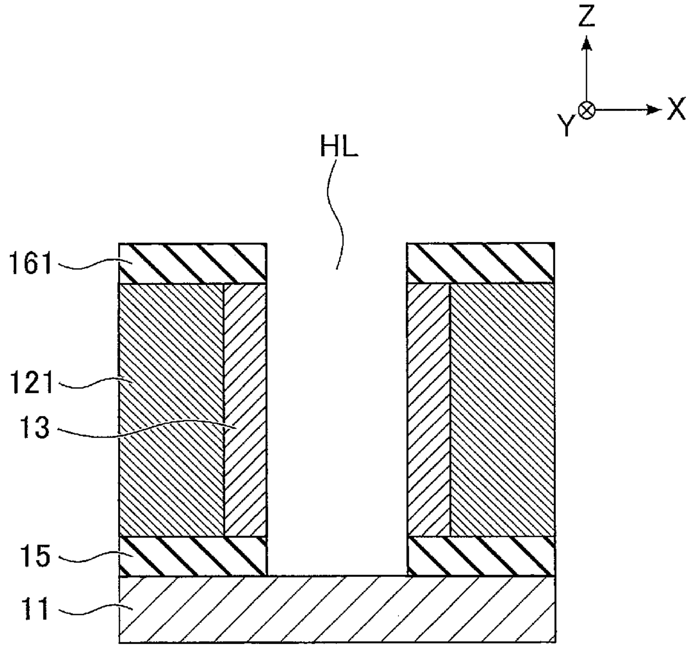
FIG. 8 shows an example of a cross-sectional structure of the semiconductor device 100 during manufacturing according to the first embodiment.
Figure 9:
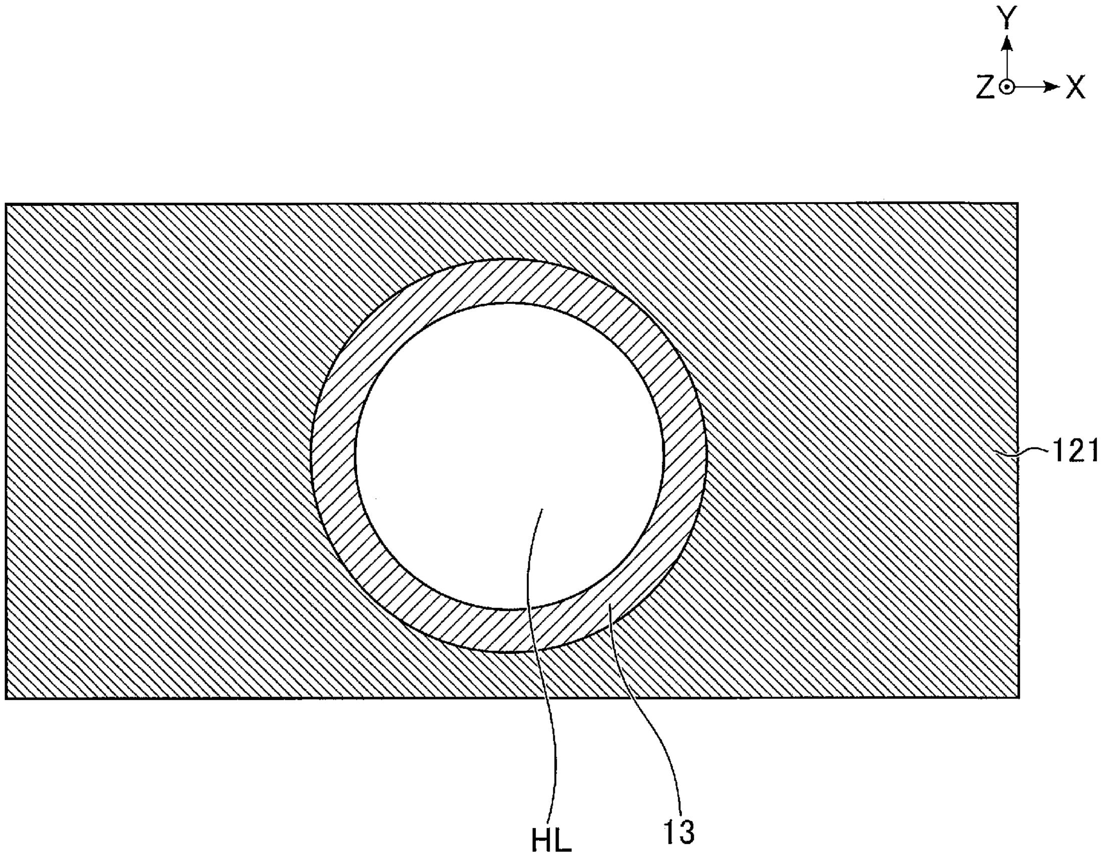
FIG. 9 shows an example of a cross-sectional structure of the semiconductor device 100 during manufacturing according to the first embodiment.

In step S13, a conductor 13, which functions as a gate electrode GE, is formed, as shown in FIGS. 8 and 9. First, the conductor 121 is partially recessed. Specifically, the conductor 121 exposed to a side surface of the hole HL is partially removed by performing wet etching through the hole HL. Thereby, the side surface of the hole HL is processed into a shape from which the conductor 121 has been partially removed.

Subsequently, a conductor 13 is buried into a space generated by the partial removal of the conductor 121. In this manner, the conductor 13 is buried into a space obtained by anisotropically etching a portion of the conductor 121. Accordingly, it is ideal that the conductor 13 have a substantially uniform thickness. The term "substantially uniform" includes errors caused by variations in manufacturing.

Figure 11:
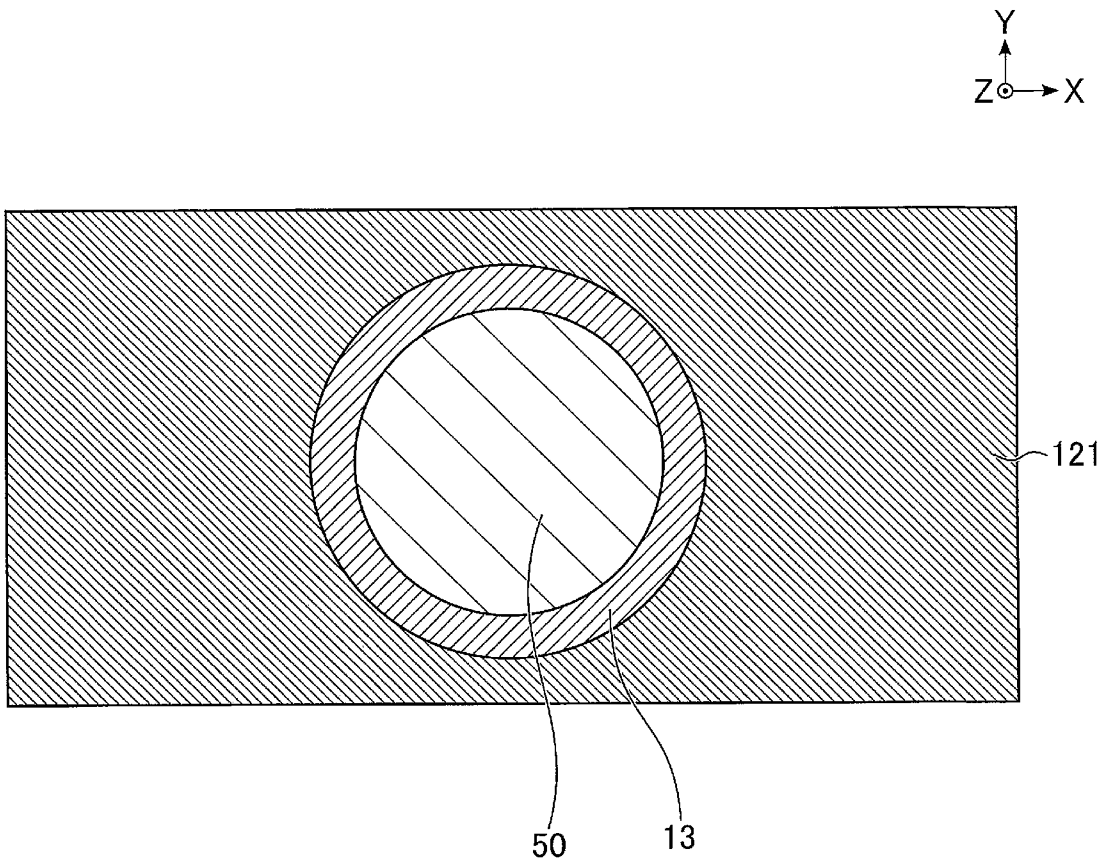
FIG. 11 shows an example of a cross-sectional structure of the semiconductor device 100 during manufacturing according to the first embodiment.

In step S14, a sacrificial member 50 is buried, as shown in FIGS. 10 and 11. The sacrificial member 50 is buried into the hole HL. The sacrificial member 50 is formed in a region in which a pillar PI is to be formed. The sacrificial member 50 is, for example, amorphous silicon.

Figure 13:
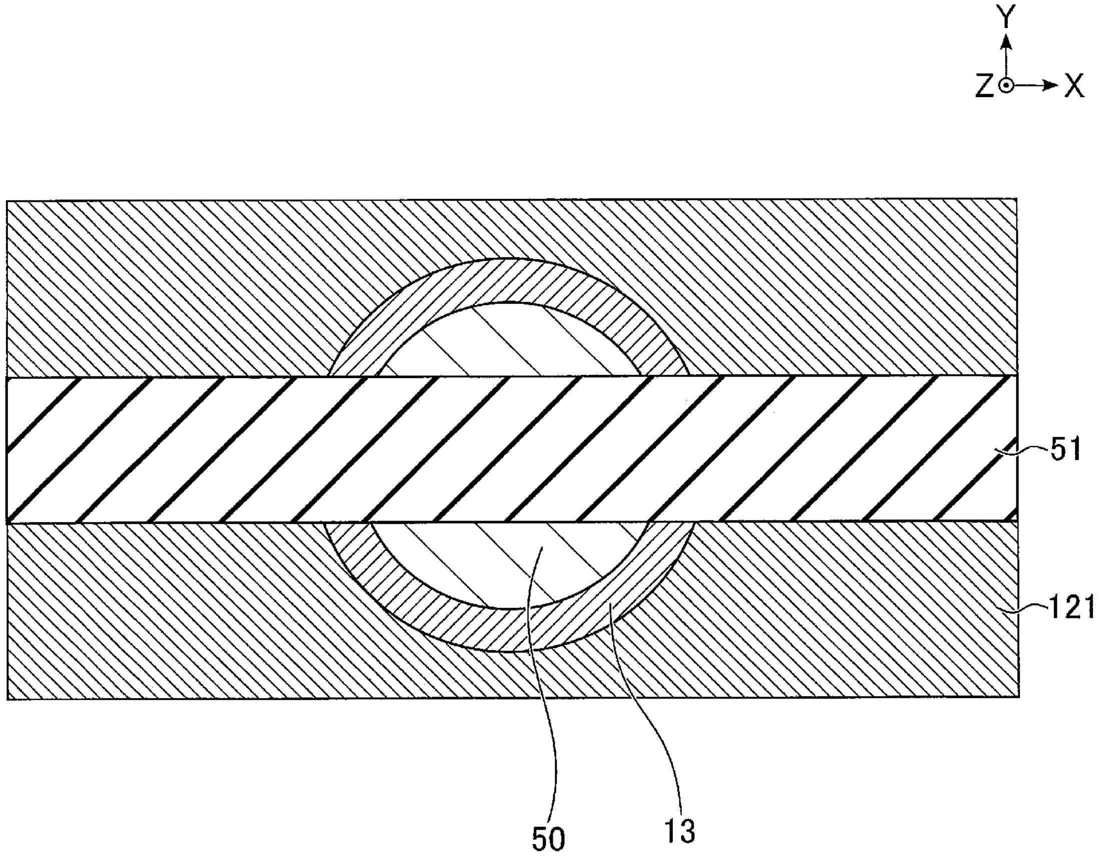
FIG. 13 shows an example of a planar layout of the semiconductor device 100 during manufacturing according to the first embodiment.

In step S15, a resist 51 is applied, as shown in FIGS. 12 and 13. FIG. 13 is an XY plane diagram in which the structure of FIG. 12 is viewed from the +Z side in the Z axis. First, the insulator 161 is removed. Subsequently, a resist is applied by, for example, photolithography onto a region of the conductor 121 in which the conductor 12 (gate electrode) is to be formed. The resist 51 is applied so as to cover at least the region in which the conductor 12 is to be formed. The resist 51 is, for example, applied in a shape extending along the X axis.

Figure 15:
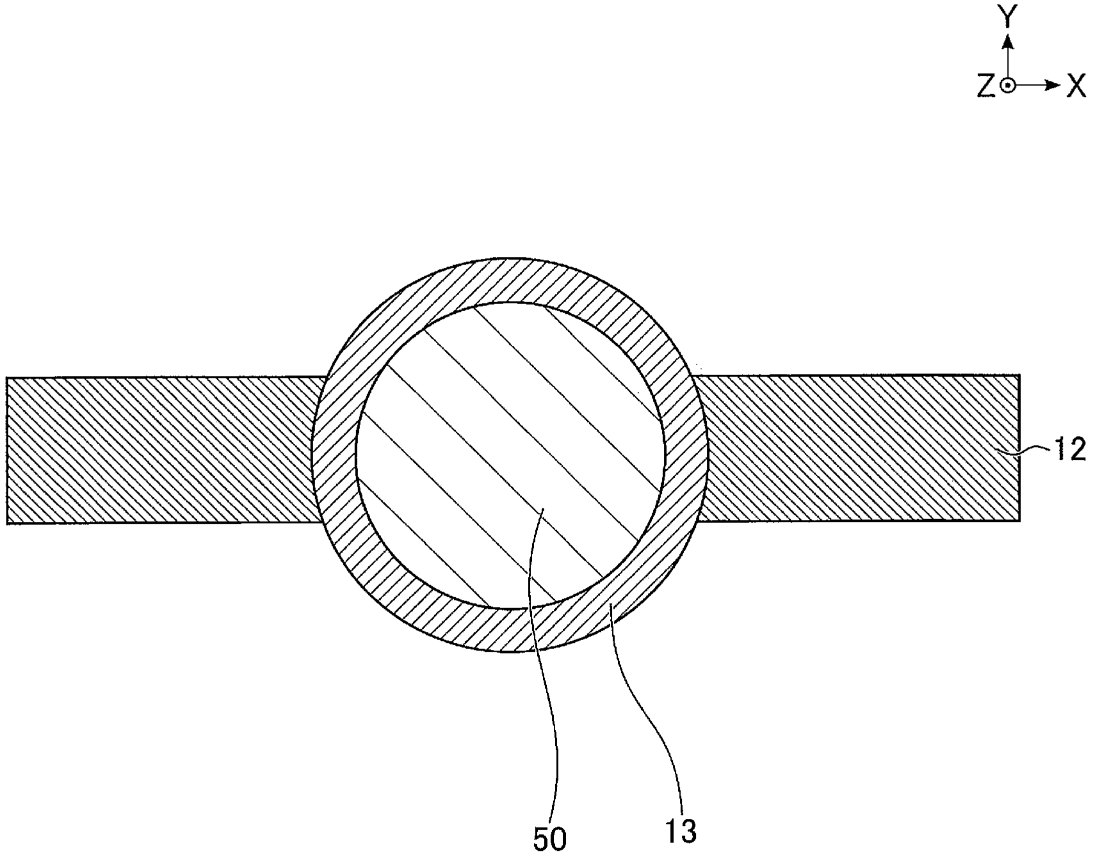
FIG. 15 shows an example of a cross-sectional structure of the semiconductor device 100 during manufacturing according to the first embodiment.

In step S16, a conductor 12 is formed, as shown in FIGS. 14 and 15. A portion of the conductor 121 other than a region in which the resist is applied in step S15 and a region therebelow is etched, and thereby the insulator 15 is exposed. The etching is performed using, for example, anisotropic etching such as RIE. The conductor 121 subjected to the etching processing is referred to as a "conductor 12". That is, a conductor 12 is formed by etching the conductor 121. Subsequently, the resist applied in step S15 is removed.

In step S17, an insulator 16 is formed, as shown in FIGS. 16 and 17. Specifically, an insulator 16 is formed in a space from which the conductor 121 and the insulator 161 have been removed. The insulator 16 is formed on the insulator 15 in the space from which the conductor 121 has been removed.

In step S18, a plurality of pillars PI are formed, as shown in FIGS. 18 and 19. First, the sacrificial member formed in step S14 is etched. Through the removal of the sacrificial member 50, a plurality of holes HL are formed. In the holes HL, the conductors 11 and 13 are exposed.

Subsequently, a second gate insulating film 18 is formed on a surface of each hole HL. Thereafter, a first gate insulating film 17 is formed on a surface of the second gate insulating film 18. The first gate insulating film 17 and the second gate insulating film 18 are formed by, for example, chemical vapor deposition (CVD), etc. The first gate insulating film 17 and the second gate insulating film 18 formed at a bottom portion of the hole HL, for example, are partially removed by, for example, anisotropic etching such as RIE. Thereby, a surface of the conductor 11 is exposed in the hole HL.

Thereafter, an oxide semiconductor 19 is formed. The oxide semiconductor 19 is buried into the entire hole HL by, for example, atomic layer deposition (ALD). The oxide semiconductor 19 is in contact with the conductor 11 at a bottom surface of the hole HL. The oxide semiconductor 19 is in contact with the first gate insulating film 17 at, for example, a side surface of the hole HL.

In step S19, a conductor 14, which functions as a top electrode TE, is formed, as shown in FIG. 20. Specifically, first, the oxide semiconductor 19 is etched back. In the etch-back process, a portion of the oxide semiconductor 19 formed in a layer above the layer in which the insulator 16 is formed, for example, is removed. After the etch-back process, top surfaces of the insulator 16, the first gate insulating film 17, the second gate insulating film 18, and the oxide semiconductor 19 may be planarized through chemical mechanical polishing (CMP). Subsequently, a conductor 14 is formed on the top surfaces of the insulator 16, the first gate insulating film 17, the second gate insulating film 18, and the oxide semiconductor 19. The conductor 14 is formed by, for example, sputtering.

Through the above-described manufacturing steps of the semiconductor device 100 according to the first embodiment, the semiconductor device 100 is formed. The above-described manufacturing steps are merely an example, and are not limited thereto. For example, other processing may be inserted between the manufacturing steps, and some of the steps may be omitted or integrated. Also, the order of the manufacturing steps may be switched as long as a problem will not occur.

<1-3> Advantages (Effects) of First Embodiment

With the above-described semiconductor device 100 according to the first embodiment, it is possible to improve the properties of the semiconductor device 100. Hereinafter, detailed effects of the semiconductor device 100 according to the first embodiment will be described.

The semiconductor device 100 according to a comparative example of the first embodiment will be described with reference to FIGS. 21 and 22. The semiconductor device 100 and a conductor 12 according to a comparative example of the first embodiment may be respectively referred to as a "semiconductor device 100*r*" and a "conductor 12*r*". FIG. 21 shows an example of a cross-sectional structure of a semiconductor device 100*r* according to a comparative example of the first embodiment. In FIG. 21, a cross-section of a region similar to that in FIG. 2 is extracted. FIG. 22 shows a cross-sectional structure of the semiconductor device 100*r* in a layer parallel to the surface of the substrate SU and including a gate electrode GE. That is, in FIG. 22, a cross-section of a region similar to that in FIG. 3 is extracted.

The semiconductor device 100*r* differs from the semiconductor device 100 according to the first embodiment mainly in that the conductor 13 is not provided and in terms of the shape and the formation method of a conductor 12*r*. The conductor 12*r* contacts the second gate insulating film 18, unlike the conductor 12. The conductor 12*r* is of a material similar to that of the conductor 12.

There is a demand for the second gate insulating film 18 to be, for example, smaller in thickness to achieve a reduced circuit area. However, if the second gate insulating film 18 is formed with a smaller thickness, oxygen contained in the oxide semiconductor 19 may be removed to interlayer insulating films such as the insulators 15 and 16 or the gate electrode. In particular, a metal contained in the gate electrode may remove oxygen contained in the oxide semiconductor 19, even if the metal is not directly in contact with the oxide semiconductor 19.

If the oxygen contained in the oxide semiconductor 19 is removed, fluctuations will occur in the Fermi level of the oxide semiconductor 19. Specifically, the Fermi level of the oxide semiconductor 19 may fluctuate at a value close to the Fermi level of the gate electrode. With the Fermi level of the oxide semiconductor 19 fluctuating at a value close to the Fermi level of the gate electrode, the threshold voltage of the semiconductor device 100 may decrease.

On the other hand, in the semiconductor device 100 according to the first embodiment, the gate electrode is designed to effectively suppress a decrease in threshold voltage. As described above, the semiconductor device 100 includes a conductor 13 between the conductor 12 and the second gate insulating film 18. The conductor 13 contains a material with a higher work function than the conductor 12.

Compared to the case where a material with a lower work function is used as the gate electrode, the threshold voltage of the semiconductor device becomes high in the case where a material with a higher work function is used. Accordingly, the semiconductor device 100 including a conductor 13, which is of a material with a high work function, as a gate electrode, can be designed to have a greater threshold voltage than the semiconductor device 100*r* not including the conductor 13. Thus, the semiconductor device 100 is capable of setting the threshold voltage at a high value compared to the semiconductor device 100*r*, even after the oxygen contained in the oxide semiconductor 19 is removed therefrom.

A material with a high work function is not easily bonded with oxygen compared to a material with a low work function. This is because, for example, a material with a high work function requires more energy to release electrons than a material with a low work function. Accordingly, oxygen is not easily removed from the oxide semiconductor 19 when it is close to the conductor 13 compared to when it is close to the conductor 12. In the semiconductor device 100, since the conductor 13 is provided between the conductor 12 and the second gate insulating film 18, oxygen is not easily removed from the oxide semiconductor 19 compared to the semiconductor device 100*r* in which the second gate insulating film 18 and the conductor 12*r* are in contact with each other. The semiconductor device 100 may suppress a decrease in threshold voltage with oxygen not being easily removed from the oxide semiconductor 19.

Also, a material with a high work function such as the conductor 13 may have a low electrical conductivity compared to a material with a low work function, such as the conductor 12. Accordingly, the gate electrode GE of the semiconductor device 100 includes a first gate electrode and a second gate electrode. Specifically, the gate electrode of the semiconductor device 100 includes conductors 12 and 13. The conductor 13, which is of a material with a high work function, is used in a portion of the gate electrode GE that is in contact with the pillar PI, and the conductor 12 is used in the other portions of the gate electrode GE. The conductor 12 is of a material with a higher electrical conductivity than the conductor 13. Accordingly, compared to when the conductor 13 is used for the entire gate electrode GE, the electrical conductivity can be increased.

That is, with the semiconductor device 100 according to the first embodiment, it is possible to maintain the electrical conductivity of the entire gate electrode GE at a high level by virtue of the conductor 12, while suppressing a decrease in threshold voltage by virtue of the conductor 13.

Also, the manufacturing steps of the semiconductor device 100*r* do not include, for example, the processing from step S13 to step S17, unlike the semiconductor device 100. That is, a plurality of pillars PI are respectively formed in a plurality of holes HL formed in step S12.

Accordingly, in the semiconductor device 100*r*, the shape of the conductor 12*r* is determined at the point in time at step S11. That is, a sufficient margin cannot be secured for the Y-axis width of the conductor 12*r*, which needs to have a final shape with suitably adjusted dimensions at the point in time at step S11. Accordingly, each hole HL formed in step S12 may be at a location deviated from the conductor 12*r* as viewed in the Y axis, as shown in FIG. 23. This is due to, for example, misalignment, etc. in lithography. FIG. 23 is a cross-sectional view of the semiconductor device 100*r* according to a comparative example of the first embodiment upon occurrence of misalignment in step S12.

If a hole HL is formed at a location deviated from the conductor 12*r* as viewed in the Y axis, there may be a location where the conductor 12*r* in the final shape does not contact the pillar PI. That is, the pillar PI is formed in a shape not partially including a gate electrode. With such a shape, decoupling may occur in the portion not including a gate electrode. In addition, since the pillar PI no longer has a shape whose entire periphery is surrounded by a gate electrode, variations may be caused in the threshold voltage of the semiconductor device 100*r*.

On the other hand, in the semiconductor device 100 according to the first embodiment, a gate electrode may be formed to effectively suppress the effects caused by misalignment. In the semiconductor device 100, the shape of the conductor 12 is not determined at the point in time at step S11. Accordingly, a large Y-axis width can be secured for the conductor 121 (later conductor 12), in view of a margin at later processing. By securing a large Y-axis width for the conductor 121, it is possible to form, in the semiconductor device 100, a hole HL that does not protrude from the conductor 121. That is, with the semiconductor device 100, it is possible to prevent decoupling caused by a deficit in the gate electrode. The conductor 121 secured with a large Y-axis width may be adjusted to have a final shape (conductor 12) through the step S16.

Furthermore, in step S13 of the semiconductor device 100, the conductor 121 is partially recessed from a side surface of the hole HL, and thereby a conductor 13 is formed. That is, as described above, the conductor 13 is buried into the space obtained by anisotropically etching a portion of the conductor 121. Accordingly, it is ideal that the conductor 13 be formed to have a substantially uniform thickness in the periphery of the pillar PI. The term "substantially uniform" includes errors caused by variations in manufacturing. With the gate electrode being formed in a shape that surrounds the entire periphery of the pillar PI in a substantially uniform manner, it is possible in the semiconductor device 100 to suppress variations in threshold voltages.

That is, with the method of manufacturing the semiconductor device 100 according to the first embodiment, it is possible to form a gate electrode with a substantially uniform thickness in the periphery of the pillar PI, without being affected by misalignment in lithography.

<2> Modification of First Embodiment

<2-1> Configuration (Structure)

In the above-described semiconductor device 100 according to the first embodiment, an example has been shown in which the conductor 12 has a shape that extends along the X axis. However, the conductor 12 is not limited to the above-described structure. The semiconductor device 100 and the conductor 12 according to the modification of the first embodiment may be hereinafter respectively referred to as a "semiconductor device 100*b*" and a "conductor 12*b*".

Figure 24:
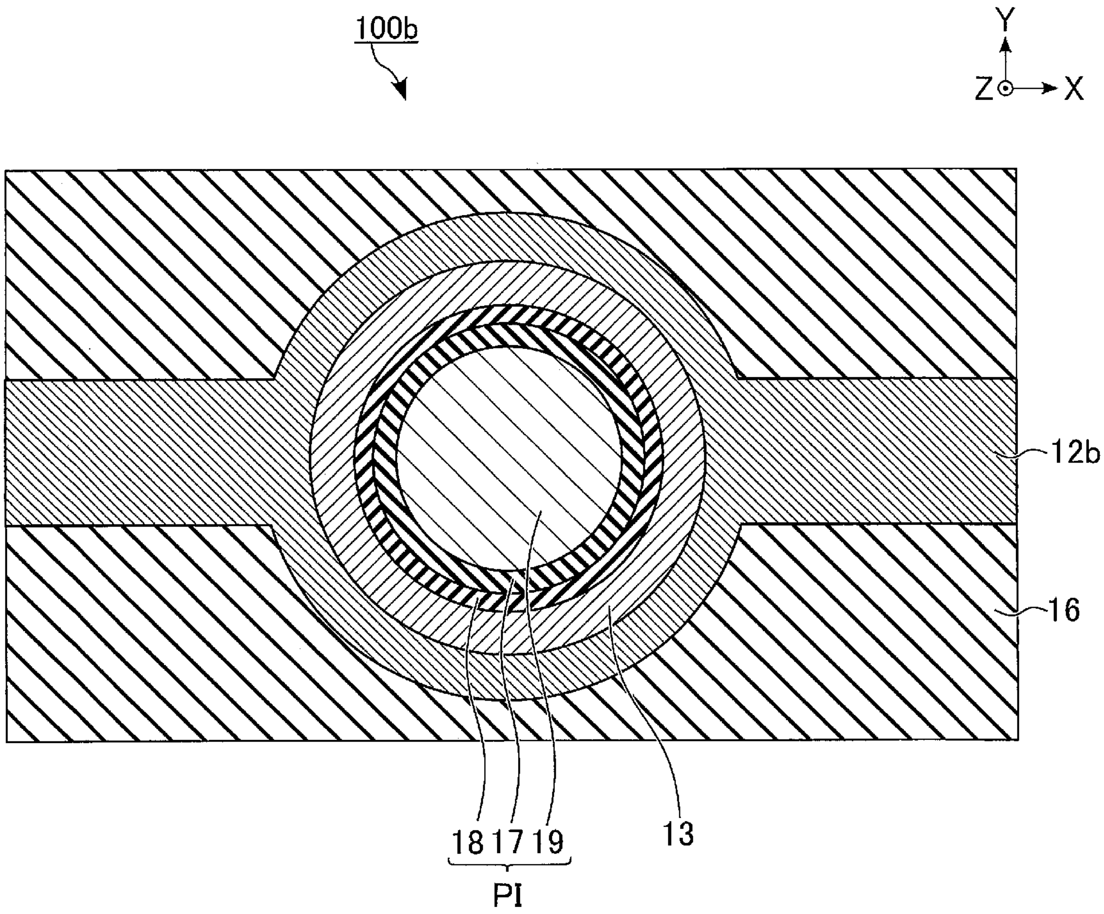
FIG. 24 shows an example of a cross-sectional structure of a semiconductor device 100*b* according to a modification of the first embodiment.

FIG. 24 shows an example of a cross-sectional structure of a semiconductor device 100*b* according to a modification of the first embodiment. FIG. 24 shows a cross-sectional structure of the semiconductor device 100*b* in a layer parallel to the surface of the substrate SU and including the gate electrode GE, similarly to FIG. 3.

As shown in FIG. 24, in the semiconductor device 100*b* according to the modification, the conductor 12*b* may have a shape that surrounds the periphery of the conductor 13. A detailed structure will be shown below. In a cross section including the gate electrode GE, the oxide semiconductor 19, the first gate insulating film 17, the second gate insulating film 18, and the conductor 13 have a structure similar to that of the semiconductor device 100 according to the first embodiment.

The conductor 12*b* includes a portion that surrounds a side surface of the conductor 13 and a portion that extends along the X axis. Thus, since the conductor 12*b* surrounds the side surface of the conductor 13, an area of a region of the conductor 12*b* that is in contact with the conductor 13 becomes large compared to that of the conductor 12 of the semiconductor device 100. The conductor 12*b* is of a material similar to that of the conductor 12, and a description thereof will be omitted.

<2-2> Method of Manufacturing Semiconductor Device 100*b*

Hereinafter, an example of manufacturing steps of the semiconductor device 100*b* according to the modification of the first embodiment will be described. FIG. 25 shows an example of a planar layout of the semiconductor device 100*b* during manufacturing according to the modification of the first embodiment. FIG. 26 shows an example of a cross-sectional structure of the semiconductor device 100*b* during manufacturing according to the modification of the first embodiment. FIGS. 25 and 26 respectively show regions similar to those in FIGS. 13 and 15.

First, similarly to the semiconductor device 100, steps S10 to S14 are sequentially performed.

Subsequently, in step S15*b*, a resist (protective member) is applied, as shown in FIG. 25. First, the insulator 161 is removed. Subsequently, a resist is applied by, for example, photolithography, onto a region of the conductor 121 in which a conductor 12*b* (gate electrode) is to be formed. The resist is applied so as to cover at least the region in which the conductor 12*b* is to be formed. The resist is, for example, applied at least onto a region above the conductor 121 surrounding the periphery of the conductor 13. Also, the resist is applied in a shape that extends along the X axis so as to connect at least the two regions. The resist may cover a portion above the sacrificial member 50.

In step S16*b*, a conductor 12*b* is formed, as shown in FIG. 26. A portion of the conductor 121 other than a region in which the resist is applied in step S15*b* and a region therebelow is etched, and thereby the insulator 15 is exposed. The etching is performed using, for example, anisotropic etching such as RIE. The conductor 121 subjected to the etching process is also referred to as a "conductor 12*b*". That is, a conductor 12*b* is formed by etching the conductor 121. The conductor 12*b* differs from the conductor 12 in terms of, for example, the shape. Subsequently, the resist applied in step S15*b* is removed.

Thereafter, similarly to the semiconductor device 100, steps S17 to S19 are sequentially performed. Thereby, the semiconductor device 100*b* according to the modification of the first embodiment is formed. The above-described manufacturing steps are merely an example, and other processing may be inserted between the manufacturing steps.

<2-3> Advantages (Effects) of Semiconductor Device 100*b*

With the above-described semiconductor device 100*b* according to the modification of the first embodiment, it is possible to improve the properties of the semiconductor device 100*b*, similarly to the semiconductor device 100.

Since the semiconductor device 100*b* includes, as a gate electrode, a conductor 13 of a material with a high work function, it is possible to suppress a decrease in threshold voltage, similarly to the semiconductor device 100.

Moreover, similarly to the semiconductor device 100, with the method of manufacturing the semiconductor device 100*b*, it is possible to form a gate electrode with a substantially uniform thickness in the periphery of the pillar PI, without being affected by misalignment in lithography.

Furthermore, with the semiconductor device 100*b*, it is possible to maintain the electrical conductivity of the entire gate electrode GE at a higher level. The gate electrode GE of the semiconductor device 100*b* includes a first gate electrode and a second gate electrode, similarly to the semiconductor device 100. Specifically, the gate electrode of the semiconductor device 100*b* includes conductors 12*b* and 13. The conductor 12*b* has a shape that surrounds the conductor 13. By providing a conductor 12*b* of a material with a high electrical conductivity in the periphery of the conductor 13, the semiconductor device 100*b* achieves a higher electrical conductivity than the semiconductor device 100. That is, the semiconductor device 100*b* maintains the electrical conductivity of the entire gate electrode GE at a higher level by virtue of the conductor 12*b*, while suppressing a decrease in threshold voltage by virtue of the conductor 13.

<3> Second Embodiment

Hereinafter, a semiconductor device 200 according to a second embodiment will be described.

<3-1> Configuration (Structure)

Hereinafter, an example of a structure of the semiconductor device 200 according to the second embodiment will be described.

FIG. 27 is a planar view showing an example of a planar layout of the semiconductor device 200 according to the second embodiment. As shown in FIG. 27, the semiconductor device 200 includes a plurality of pillars PI2 and a plurality of bit lines BL.

The pillars PI2 extend along the Z axis. The pillars PI2 include, in an XY plane, for example, eight columns of pillar PI2. In each column, the pillars PI2 are aligned along the X axis. A position of a pillar PI2 in one of two adjacent columns of pillars PI2 in the X direction and a position of a pillar PI2 in the other column in the X direction are shifted. In other words, pillars PI2 in two adjacent columns are arranged in a zig-zag pattern in the XY plane. FIG. 27 shows an example in which eight columns of pillars PI2 are provided; however, the number and arrangement of the pillars PI2 is not limited thereto, and may be suitably varied. Each of the pillars PI2 functions as, for example, a single vertical transistor.

The bit lines BL, each extending along the Y direction, are aligned along the X direction. Each bit line BL is arranged so as to overlap a single pillar PI2 in each row of the pillars PI2. In this case, each bit line BL overlaps +X-side portions of pillars PI2 in an odd-numbered column as viewed from the X axis, and −X-side portions of pillars PI2 in an even-numbered column as viewed from the X axis.

A bit line BL that overlaps pillars PI2 and the pillars PI2 that the bit line BL overlaps are electrically coupled. The coupling between the pillars PI2 and the bit lines BL will be described in detail later. The number of pillars PI2 that overlap each bit line BL may be designed to be a given number.

Figure 29:
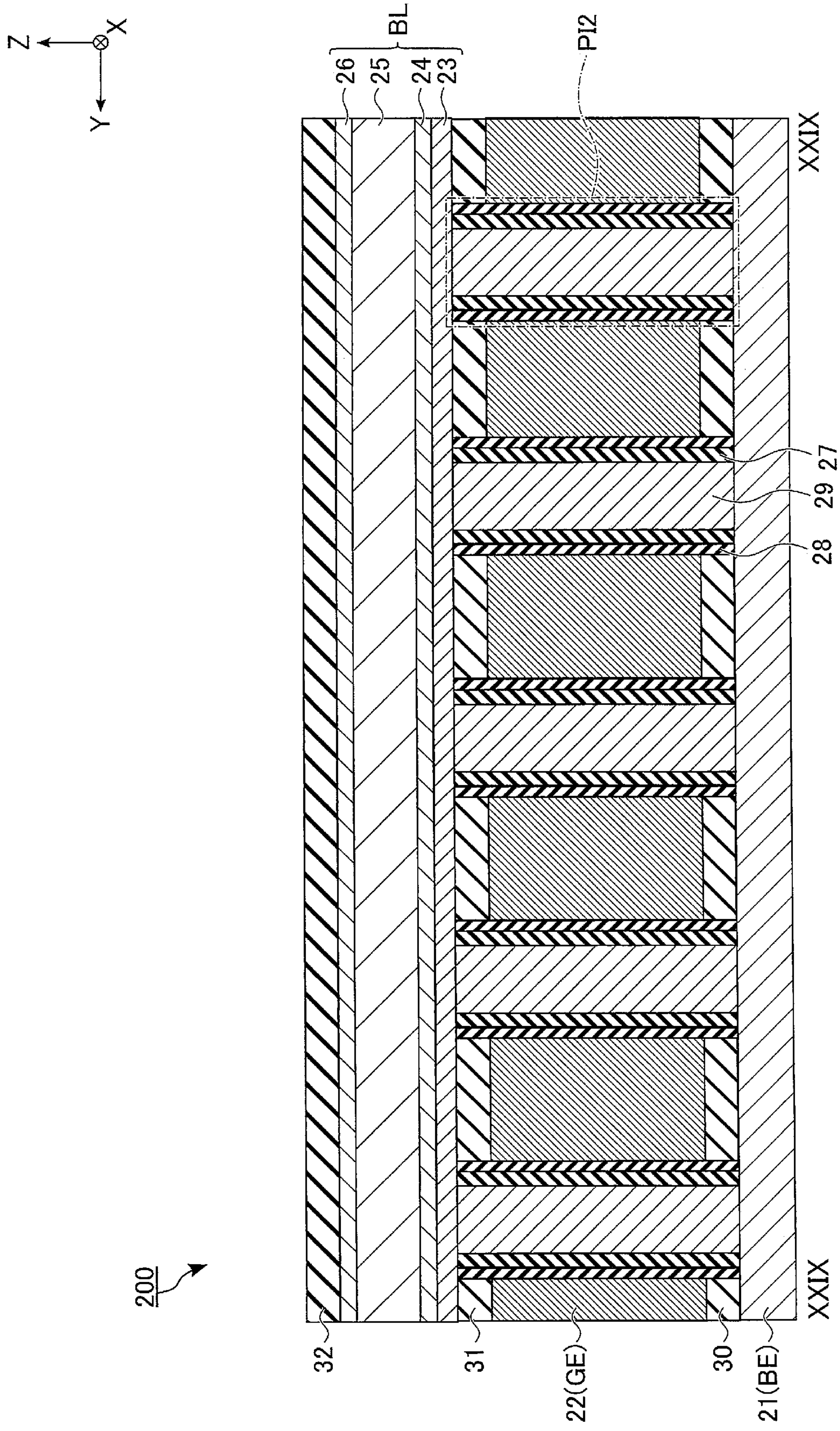
FIG. 29 is a cross-sectional view taken along line XXIX-XXIX of FIG. 27, showing an example of a cross-sectional structure of the semiconductor device 200 according to the second embodiment.

FIG. 28 is a cross-sectional view taken along line XXVIII-XXVIII of FIG. 27, showing an example of a cross-sectional structure of the semiconductor device 200 according to the second embodiment. FIG. 29 is a cross-sectional view taken along line XXIX-XXIX of FIG. 27, showing an example of a cross-sectional structure of the semiconductor device 200 according to the second embodiment. The semiconductor device 200 includes, as shown in FIGS. 28 and 29, a plurality of conductors 21 and 22, a plurality of insulators 30-32, a plurality of bit lines BL, a plurality of members SLT, and a plurality of pillars PI2.

The conductor 21 is, for example, provided above a substrate SU (not illustrated). An insulator 30 is provided on the conductor 21. A conductor 22 is provided on the insulator 30. An insulator 31 is provided on the conductor 22. A plurality of bit lines BL are provided on the insulator 31. An insulator 32 is provided on the bit lines BL.

The conductor 21 contains, for example, Cu or W. Each of the insulators 30-32 contains, for example, $SiO_2$. The conductor 22 contains, for example, W, Cu, Mo, Ru, Rh, Co, AlCu, NiAl, or RuAl.

The bit lines BL contain an oxide semiconductor 23 and conductors 24-26. The oxide semiconductor 23 is provided on the insulator 31. The oxide semiconductor 23 contains, for example, an indium oxide, a gallium oxide, and a zinc oxide. For the oxide semiconductor 23, an oxide containing at least one of indium, zinc, and tin (e.g., InO, InZnO, InSnO, SnO, ZnO, and ZnSnO) may be used.

The conductor 24 is provided on the oxide semiconductor 23. The conductor 25 is provided on the conductor 24. The conductor 26 is provided on the conductor 25.

The conductor 24 contains, for example, titanium nitride (TiN). The conductor 25 contains, for example, W. The conductor 26 contains, for example, TiN. The conductors 24 and 26 function as, for example, a barrier metal. The conductors 24 and 26 may, for example, prevent W contained in the conductor 25 from being diffused to an adjacent insulator. The conductors 24 and 26 may not be provided according to the design.

A plurality of pillars PI2 are provided between the conductor 21 and the oxide semiconductor 23. The pillars PI2 are provided in a pillar shape extending along, for example, the Z axis. Side surfaces of the pillar PI2 contact the conductor 22. Bottom ends of the pillars PI2 are electrically coupled to the conductor 21. Top ends of the pillars PI2 are electrically coupled to the bit lines BL.

Each pillar PI2 includes a first gate insulating film 27, a second gate insulating film 28, and an oxide semiconductor 29. The oxide semiconductor 29 extends along the Z axis, and is provided at a central part of the pillar PI2. The oxide semiconductor 29 is formed in, for example, a cylindrical shape. A lower end of the oxide semiconductor 29 is in contact with the conductor 21. An upper end of the oxide semiconductor 29 is in contact with the oxide semiconductor 23.

The oxide semiconductor 29 contains, for example, an indium oxide, a gallium oxide, and a zinc oxide. For the oxide semiconductor 19, an oxide containing at least one of indium, zinc, and tin (e.g., InO, InZnO, InSnO, SnO, ZnO, and ZnSnO) may be used. The oxide semiconductor 29 and the oxide semiconductor 23 may be of an identical material.

The first gate insulating film 27 covers, for example, the periphery of the oxide semiconductor 29. The first gate insulating film 27 is provided, for example, in a cylindrical shape in the pillar PI2. The first gate insulating film 27 contains, for example, an insulator such as silicon oxide.

The second gate insulating film 28 covers, for example, the periphery of the first gate insulating film 27. The second gate insulating film 28 is provided, for example, in a cylindrical shape in the pillar PI2. The second gate insulating film 28 contains, for example, an insulator such as silicon nitride (SiN). The second gate insulating film 28 may be provided with a smaller thickness than the first gate insulating film 27. The second gate insulating film 28 may not be provided, depending on the design.

A plurality of members SLT are provided, with each member SLT interposed between two bit lines BL adjacent to each other as viewed in the X axis, even though illustration thereof is omitted in FIG. 27. The members SLT, each extending along the Y axis, are aligned along the X axis. Two bit lines BL adjacent to each other as viewed in the X axis are insulated by the member SLT.

Each member SLT is arranged so as to overlap a single pillar PI2 in each row of the pillars PI2. In this case, the member SLT overlaps −X-side portions of pillars PI2 in an odd-numbered column as viewed from the X axis, and +X-side portions of pillars PI2 in an even-numbered column as viewed from the X axis.

The member SLT splits each of the insulators 31 and 32, the oxide semiconductor 23, and the conductors 24-26. It suffices that a bottom surface of the member SLT reaches, for example, the insulator 31. Upper ends of the first gate insulating film 27, the second gate insulating film 28, and the oxide semiconductor 29 partially contact the member SLT. An upper end of the oxide semiconductor 29 includes a portion contacting the member SLT and a portion contacting the oxide semiconductor 23. The oxide semiconductor 29 may be integrally formed with the oxide semiconductor 23.

The oxide semiconductor 23 and the conductors 24-26 extend along the Y axis. In other words, in an XY planar view from the +Z side (top view), the oxide semiconductor 23 has a large area than the oxide semiconductor 29.

The conductor 21 functions as a bottom electrode BE. The conductor 22 functions as a gate electrode GE. Each of the bottom electrode BE and the bit lines BL functions as a source electrode or a drain electrode of the semiconductor device 200. The gate electrode GE functions as a gate electrode of the semiconductor device 200. The pillars PI2 function as current paths (channels) of the semiconductor device 200.

<3-2> Method of Manufacturing Semiconductor Device 200

FIG. 30 is a flowchart showing an example of steps of manufacturing the semiconductor device 200 according to the second embodiment. Each of FIGS. 31 to 36 shows an example of a cross-sectional structure during manufacturing of the semiconductor device 200 according to the second embodiment. Each of FIGS. 31 to 35 shows a cross-section of a region identical to the region shown in FIG. 28. Hereinafter, an example of manufacturing steps relating to formation of the semiconductor device 200 according to the second embodiment will be described by suitably referring to FIG. 30. As shown in FIG. 30, a method of manufacturing the semiconductor device 200 according to the second embodiment includes, for example, steps S21 to S25 performed sequentially.

In step S21, a plurality of holes HL2 are formed, as shown in FIG. 31. Specifically, first, a conductor 21, which functions as a bottom electrode BE, is formed above a substrate SU (not illustrated). The conductor 21 is formed using, for example, sputtering. Subsequently, an insulator a conductor 22, and an insulator 31 are sequentially formed on the conductor 21. The conductor 22 is formed using, for example, sputtering.

Subsequently, a plurality of holes HL2 are formed in regions in which a plurality of pillars PI2 are respectively to be formed. Each hole HL2 is formed by, for example, photolithography and anisotropic etching, so as to reach a top surface of the conductor 21 from a top surface of the insulator 31. For the anisotropic etching, RIE, for example, is employed.

In step S22, a plurality of pillars PI2 are formed, as shown in FIG. 32. First, a second gate insulating film 28 is formed on a surface of each hole HL2. Thereafter, a first gate insulating film 27 is formed on a surface of the second gate insulating film 28. The first gate insulating film 27 and the second gate insulating film 28 are formed by, for example, CVD, etc.

Subsequently, the first gate insulating film 27 and the second gate insulating film 28 formed at a bottom portion of the hole HL2, for example, are partially removed by, for example, anisotropic etching such as RIE. Thereby, a surface of the conductor 21 is exposed in the hole HL2.

Thereafter, an oxide semiconductor 29 is formed. The oxide semiconductor 29 is buried into the entire hole HL2 by, for example, ALD. The oxide semiconductor 29 is in contact with the conductor 21 at the bottom surface of the hole HL2. The oxide semiconductor 29 is, for example, in contact with the first gate insulating film 27 at a side surface of the hole HL2.

Subsequently, a portion of the oxide semiconductor 29 formed in a layer above the layer in which the insulator 31 is formed is removed. Thereafter, top surfaces of the insulator 31, the first gate insulating film 27, the second gate insulating film 28, and the oxide semiconductor 29 may be planarized through CMP.

In step S23, an oxide semiconductor 23 is formed, as shown in FIG. 33. Specifically, an oxide semiconductor 23 is formed on top surfaces of the insulator 31, the first gate insulating film 27, the second gate insulating film 28, and the oxide semiconductor 29. The oxide semiconductor 23 may be integrally formed with the oxide semiconductor 29.

Figure 34:
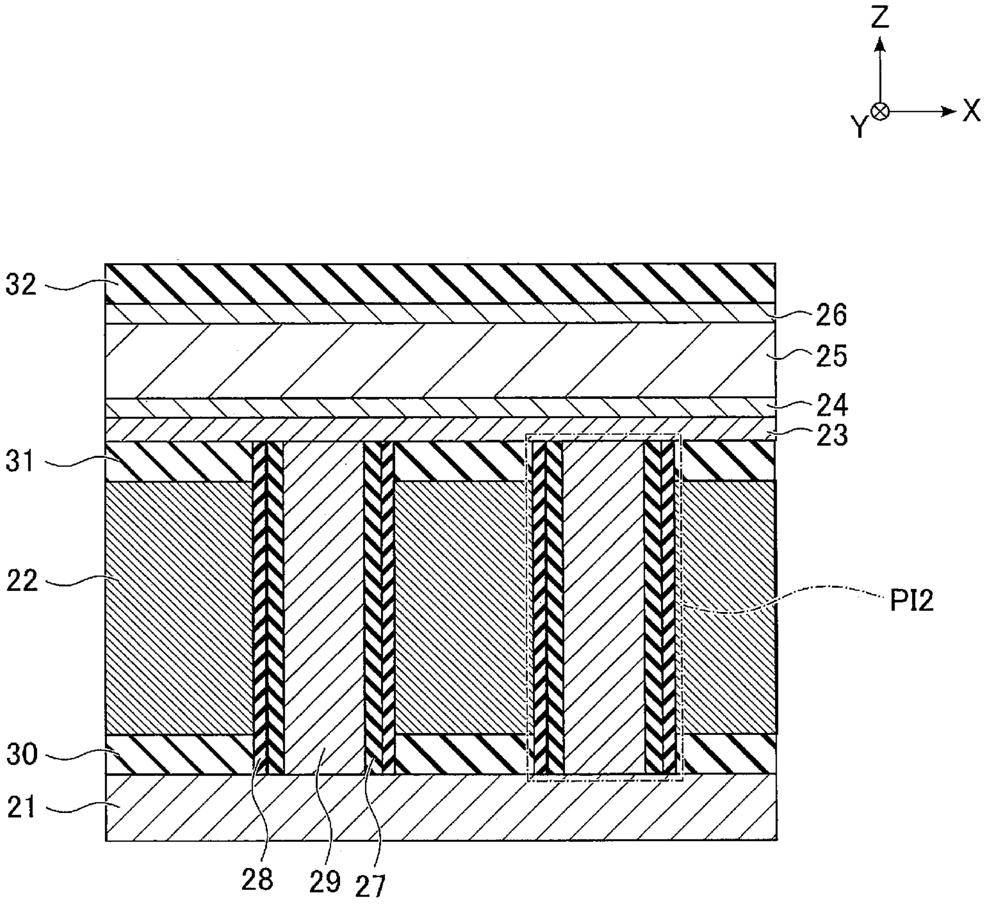
FIG. 34 shows an example of a cross-sectional structure of the semiconductor device 200 during manufacturing according to the second embodiment.

In step S24, materials that function as the bit lines BL are formed, as shown in FIG. 34. Specifically, first, a conductor 24 is formed on a top surface of the oxide semiconductor 23. Subsequently, a conductor 25 is formed on a top surface of the conductor 24. Thereafter, a conductor 26 is formed on a top surface of the conductor 25. Subsequently, an insulator 32 is formed on a top surface of the conductor 26.

In step S25, the bit lines BL are processed, as shown in FIGS. 35 and 36. FIG. 36 shows a cross-sectional structure of a layer including the insulator 31 in the semiconductor device 200 shown in FIG. 35, as viewed from the +Z side in the Z axis. First, a plurality of slits SH (not illustrated) are formed in regions in which a plurality of members SLT are respectively to be formed. Specifically, a mask is formed by photolithography, etc., with a plurality of openings in regions in which a plurality of slits SH are respectively to be formed, and the slits SH are formed by anisotropic etching using the mask.

Each slit SH splits, for example, each of the insulators 31 and 32, the oxide semiconductor 23, and the conductors 24-26. Through the slit SH, the conductor 22, the first gate insulating film 27, the second gate insulating film 28, and the oxide semiconductor 29 are partially exposed. An upper end of the oxide semiconductor 29 includes a portion contacting the oxide semiconductor 23 and a portion exposed by the slit SH.

Subsequently, a plurality of members SLT are formed so as to respectively fill in the slits SH. Each member SLT is arranged so as to overlap a single pillar PI2 in each row of the pillars PI2 in an XY planar view.

By forming the members SLT, a plurality of bit lines BL extending along the Y axis and aligned along the X axis are formed. In other words, each member SLT is buried between two adjacent bit lines BL.

Through the above-described manufacturing steps of the semiconductor device 200 according to the second embodiment, the semiconductor device 200 is formed. The above-described manufacturing steps are merely an example, and are not limited thereto. For example, other processing may be inserted between the manufacturing steps, and some of the steps may be omitted or integrated. Also, the order of the manufacturing steps may be switched as long as a problem will not occur.

<3-3> Advantages (Effects) of Second Embodiment

With the above-described semiconductor device 200 according to the second embodiment, it is possible to improve the properties of the semiconductor device 200. Hereinafter, detailed effects of the semiconductor device 200 according to the second embodiment will be described.

As described above, the semiconductor device 200 according to the second embodiment includes the oxide semiconductor 23 at the bottommost layer of the bit lines BL. Hereinafter, a semiconductor device in which an oxide semiconductor 23 is not included at the bottommost layer of the bit lines BL may be referred to as a "semiconductor device 100*r*" according to a comparative example of the second embodiment.

In the semiconductor device 100*r*, which does not include an oxide semiconductor 23, conductors 24 and 25, for example, are in contact with an oxide semiconductor 29. If the conductors 24 and 25 are in contact with the oxide semiconductor 29, a contact resistance may increase. This is because, if the conductor 24 or 25 is brought into contact with the oxide semiconductor 29, a Schottky barrier caused by the materials may increase.

To decrease the contact resistance between the objects, it is effective to increase the area of contact between the objects. Accordingly, the semiconductor device 200 according to the second embodiment includes an oxide semiconductor 23 at the bottommost layer of the bit lines BL. FIG. 37 shows planar views of a semiconductor device 200*r* according to a comparative example of the second embodiment and the semiconductor device 200 according to the second embodiment. As shown in FIG. 37, in the semiconductor device 200*r*, an area of a region in which the oxide semiconductor 29 is in contact with the conductor 24 or 25 is an area A.

On the other hand, in the semiconductor device 200, an area of a region in which the oxide semiconductor 23 is in contact with the conductor 24 or 25 is an area B. The area B is equal to the area of the bit lines BL in a planar shape, and the bit lines BL extend along the Y axis. Thus, the area B is larger than the area A. That is, the area of contact between the conductor 24 or 25 and the oxide semiconductor becomes larger in the semiconductor device 200, than in the semiconductor device 200*r*. Accordingly, the contact resistance between the conductor 24 or 25 and the oxide semiconductor becomes smaller in the semiconductor device 200, than in the semiconductor device 200*r*.

Moreover, since both the oxide semiconductor 23 and the oxide semiconductor 29 are oxide semiconductors, a Schottky barrier formed between the oxide semiconductor 23 and the oxide semiconductor 29 is very small. Accordingly, while the area of contact between the oxide semiconductor 23 and the oxide semiconductor 29 is the area A, the contact resistance between the oxide semiconductor 23 and the oxide semiconductor 29 is small.

A Schottky barrier formed between the oxide semiconductor 23 and the oxide semiconductor 29 is smaller than a Schottky barrier formed between the oxide semiconductor 23 and the conductor 24 or 25.

In this manner, since the semiconductor device 200 includes the oxide semiconductor 23 at the bottommost layer of the bit lines BL, it is possible to reduce a contact resistance generated between the bit lines BL and the pillars PI2.

Moreover, a structure in which a connector is provided between the oxide semiconductor 29 and the bit line BL (referred to as a "semiconductor device 200*rb*" according to a comparative example of the second embodiment) for reduction of a contact resistance between the oxide semiconductor 29 and the bit lines BL is also conceivable. The connector includes, for example, a top electrode, etc. However, manufacturing a connector, which has a multi-layer structure, may require a plurality of steps.

On the other hand, in the semiconductor device 200 according to the second embodiment, it suffices that the oxide semiconductor 23 is provided at the bottommost layer of the bit lines BL. Accordingly, the semiconductor device 200 can be manufactured at a reduced cost compared to the semiconductor device 200*rb*. Moreover, the semiconductor device 200 can be reduced in device size compared to the semiconductor device 200*rb*.

<4> Modifications of Second Embodiment

First Modification

In the above-described semiconductor device 200 according to the second embodiment, an example has been shown in which the conductor 24 of the bit lines BL is provided on the oxide semiconductor 29. However, the structure of the bit lines BL according to the second embodiment is not limited thereto. The semiconductor device 200 and the bit lines BL according to a first modification of the second embodiment may be hereinafter respectively referred to as a "semiconductor device 200*b*" and "bit lines BLb".

FIG. 38 shows an example of a cross-sectional structure of a semiconductor device 200*b* according to a first modification of the second embodiment. FIG. 38 shows a region similar to that in FIG. 28. As shown in FIG. 38, the bit lines BLb of the semiconductor device 200*b* according to the first modification may further include, between the oxide semiconductor 29 and the conductor 24, a conductor 40.

The conductor 40 contains, for example, a conductive oxide such as indium tin oxide (ITO). The conductor 40 may contain, for example, an oxide semiconductor of a material other than that contained in the oxide semiconductor 29.

By providing the conductor 40 between the oxide semiconductor 29 and the conductor 24, it is possible to decrease a contact resistance between the oxide semiconductor 29 and the conductor 24. Moreover, by providing the conductor 40 between the oxide semiconductor 29 and the conductor 24, it is possible to increase an adhesiveness between the oxide semiconductor 29 and the conductor 24.

Second Modification

In the above-described pillars PI2 of the semiconductor device 200 according to the second embodiment, an example has been shown in which a large difference in diameter is not provided between an upper portion and a lower portion of each pillar PI2. However, the structure of the pillars PI2 according to the second embodiment is not limited to the above-described one. A semiconductor device 200, pillars PI2, a first gate insulating film 27, a second gate insulating film 28, and an oxide semiconductor 29 according to a second modification of the second embodiment may be respectively referred to as a "semiconductor device 200*c*", "pillars PI2*c*", a "first gate insulating film 27*c*", a "second gate insulating film 28*c*", and an "oxide semiconductor 29*c*".

FIG. 39 shows an example of a cross-sectional structure of a semiconductor device 200*c* according to the second modification of the second embodiment. FIG. 39 shows a region similar to that in FIG. 28. As shown in FIG. 39, each pillar PI2*c* in the semiconductor device 200*c* according to the second modification includes an upper pillar PI2*c*1 and a lower pillar PI2*c*2. The lower pillar PI2*c*2 is positioned at a lower portion of the pillar PI2*c*, and the upper pillar PI2*c*1 is positioned at an upper portion of the pillar PI2*c*. The lower pillar PI2*c*2 has a shape similar to the lower portion of the pillar PI2. The upper pillar PI2*c*1 has a tapered shape at a great angle compared to, for example, the lower pillar PI2*c*2. That is, the upper portion of the pillar PI2*c* has a diameter larger than the lower portion of the pillar PI2*c*. Specifically, the oxide semiconductor 29*c*1 included in the upper pillar PI2*c*1 has a tapered shape at a great angle compared to the oxide semiconductor 29*c*2 included in the lower pillar PI2*c*2.

A method of forming the upper pillar PI2*c*1 to a have a tapered shape at a greater angle than the lower pillar PI2*c*2 will be shown below. In the semiconductor device 200*c*, the holes HL2 are adjusted, for example, in step S21. A hole HL2 in a region in which an upper pillar PI2*cl* is to be formed and a hole HL2 in which a lower pillar PI2*c*2 is to be formed may be respectively referred to as a "hole HL2*c*1" and a "hole HL2*c*2".

After a plurality of holes Hl2*c*2 are formed in a method similar to that for the semiconductor device 200, a resist covering, for example, a region other than the upper portion of each hole Hl2*c*2, is partially removed. Thereafter, a plurality of holes Hl2*c*1 are formed by etching a region below the portion from which the resist has been removed. In this manner, in the semiconductor device 200*c*, the holes Hl2*c*1 can be formed to have an intentionally larger diameter than the holes HL2*c*2. The subsequent manufacturing method is similar to that of the semiconductor device 200.

Accordingly, in the semiconductor device 200*c*, the oxide semiconductor 29*c*1 has a tapered shape at a great angle compared to the oxide semiconductor 29*c*2. In other words, the oxide semiconductor 29*c*1 has a greater thickness than the oxide semiconductor 29*c*2, and a side surface of the oxide semiconductor 29*c*2 is not positioned on an extension of a side surface of the oxide semiconductor 29*c*1.

Accordingly, an area of contact between the oxide semiconductor 23 and the oxide semiconductor 29*c* is larger than an area of contact between the oxide semiconductor 23 and the oxide semiconductor 29. As a result, a contact resistance between the oxide semiconductor 23 and the oxide semiconductor 29*c* is smaller in the semiconductor device 200*c* than in the semiconductor device 200.

In this manner, with the semiconductor device 200*c* in which the upper pillar PI2*c*1 has a tapered shape at a greater angle, it is possible to reduce a contact resistance generated between the bit lines BL and the pillars PI2*c*.

Third Modification

In the semiconductor device 200*c* according to the second modification of the second embodiment, an example has been shown in which an upper portion and a lower portion of each pillar PI2*c* are tapered at different angles. However, the structure of the pillars PI2 according to the second embodiment is not limited to the above-described one. A semiconductor device 200, pillars PI2, a first gate insulating film 27, a second gate insulating film 28, and an oxide semiconductor 29 according to a third modification of the second embodiment may be respectively referred to as a "semiconductor device 200*d*", "pillars PI2*d*", a "first gate insulating film 27*d*", a "second gate insulating film 28*d*", and an "oxide semiconductor 29*d*".

FIG. 40 shows an example of a cross-sectional structure of a semiconductor device 200*d* according to a third modification of the second embodiment. FIG. 40 shows a region similar to that in FIG. 28. As shown in FIG. 40, each pillar PI2*d* in the semiconductor device 200*d* according to the third modification includes an upper pillar PI2*d*1 and a lower pillar PI2*d*2. The lower pillar PI2*d*2 is positioned at a lower portion of each pillar PI2*d*, and the upper pillar PI2*d*1 is positioned at an upper portion of each pillar PI2*d*.

The lower pillar PI2*d*2 has a shape similar to the lower portion of the pillar PI2. The upper pillar PI2*d*1 is formed with a great diameter compared to, for example, the lower pillar PI2*d*2. That is, the upper pillar PI2*d*1 has a diameter larger than that of the lower pillar PI2*d*2.

A method of forming the upper pillar PI2*d*1 to have a diameter larger than that of the lower pillar PI2*d*2 is similar to that of the second modification. The difference from the second modification lies in, for example, the time when etching is performed.

The oxide semiconductor 29*d*1 included in the upper pillar PI2*d*1 has a large diameter compared to the oxide semiconductor 29*d*2 included in the lower pillar PI2*d*2. In other words, the oxide semiconductor 29*d*1 has a greater thickness than the oxide semiconductor 29*d*2, and a side surface of the oxide semiconductor 29*d*2 is not positioned on an extension of a side surface of the oxide semiconductor 29*d*1.

Accordingly, an area of contact between the oxide semiconductor 23 and the oxide semiconductor 29*d* is larger than an area of contact between the oxide semiconductor 23 and the oxide semiconductor 29. As a result, a contact resistance between the oxide semiconductor 23 and the oxide semiconductor 29*d* is smaller in the semiconductor device 200*d* than in the semiconductor device 200.

In this manner, with the semiconductor device 200*d* in which the upper pillar PI2*d*1 has a larger diameter, it is possible to reduce a contact resistance generated between the bit lines BL and the pillars PI2*d*.

Fourth Modification

In the above-described semiconductor device 200 according to the second embodiment, an example has been shown in which the members SLT are formed after materials that function as bit lines BL are stacked. However, the bit lines BL according to the second embodiment are not limited to the above-described manufacturing method and structure. The semiconductor device 200, the bit lines BL, the oxide semiconductor 23, the conductor 24, and the conductor 25 according to a fourth modification of the second embodiment may be hereinafter respectively referred to as a "semiconductor device 200*e*", "bit lines BLe", an "oxide semiconductor 23*e*", a "conductor 24*e*", and a "conductor 25*e*".

FIG. 41 shows an example of a cross-sectional structure of a semiconductor device 200*e* according to the fourth modification of the second embodiment. FIG. 41 shows a region similar to that in FIG. 28. The bit lines BLe of the semiconductor device 200*e* according to the fourth modification may be formed by damascene processing.

As shown in FIG. 41, for example, the bit lines BLe formed by damascene processing differ in structure from the bit lines BL. The bit lines BLe may include, for example, the oxide semiconductor 23*e* and the conductor 24*e* not only on bottom surfaces but also on side surfaces of the bit lines. Also, the bit lines BLe may not include a conductor 26.

A method of manufacturing bit lines BLe via damascene processing will be shown below. In the semiconductor device 200*e*, subsequent to step S22, for example, an insulator 34 is formed. The insulator 34 is formed on top surfaces of the insulator 31, the first gate insulating film 27, the second gate insulating film 28, and the oxide semiconductor 29.

Thereafter, regions in which the bit lines BLe are to be formed are etched, as shown in FIG. 42, and thereby a plurality of slits SH2 are formed. Each slit SH2 splits the insulator 34. Through the slit SH2, the insulator 31, the first gate insulating film 27, the second gate insulating film 28, and the oxide semiconductor 29 are partially exposed. A top surface of the oxide semiconductor 29 includes a portion contacting the insulator 34 and a portion exposed by the slit SH2.

Subsequently, an oxide semiconductor 23*e* is formed on a surface of the slit SH2. The oxide semiconductor 23*e* is formed on top surfaces of the insulator 31, the first gate insulating film 27, the second gate insulating film 28, and the oxide semiconductor 29, and a side surface of the insulator 34. The oxide semiconductor 23*e* may be integrally formed with the oxide semiconductor 29.

Subsequently, a conductor 24*e* is formed on a surface of the oxide semiconductor 23*e*. Subsequently, a conductor 25*e* is formed on a surface of the conductor 24*e*, thereby filling in the slit SH2. That is, the bit lines BLe include the oxide semiconductor 23*e*, the conductor 24*e*, and the conductor 25*e*. Thereafter, an insulator 35 is formed on top surfaces of the insulator 34 and the bit lines BLe.

<4> Other Modifications

In the first to second embodiments, the structure of each of the semiconductor devices 100 and 200 may have a structure other than those described above. The structures in the first embodiment are applicable to the second embodiment. The structures shown in the modifications of the first and second embodiments may be, either in part or in combination, applicable to the first and second embodiments.

The pillars PI and PI2 may have a tapered or anti-tapered shape, or may have a shape that bulges at the middle portion.

Herein, the term "couple" refers to electrical coupling, and does not exclude intervention of another element. Electrical coupling may have an insulator intervening as long as such coupling is capable of operating in a manner similar to electrical coupling without intervention of an insulator.

The first and second embodiments described above have been presented by way of example only, and are not intended to limit the scope of the invention. The first and second embodiments may be embodied in a variety of other forms, and various omissions, substitutions and variations may be made without departing from the spirit of the invention. The first and second embodiments and their modifications are included in the scope and spirit of the invention and are included in the scope of the claimed inventions and their equivalents.

What is claimed is:

1. A semiconductor device, comprising:
a first conductor;
a first oxide semiconductor contacting, at one end, the first conductor, and extending in a first direction intersecting a surface of the first conductor;
a first insulator surrounding a side surface of the first oxide semiconductor;
a second conductor, the second conductor and the first oxide semiconductor interposing the first insulator therebetween;
a third conductor contacting another end of the first oxide semiconductor; and
a fourth conductor extending in a second direction intersecting the first direction, and contacting the second conductor on a side opposite to the first insulator, wherein
the second conductor is of a material with a work function higher than a work function of a material of the fourth conductor, wherein
the second conductor surrounds an entire outer periphery of the first insulator in a top view.

2. The semiconductor device according to claim 1, wherein
the second conductor surrounds the first insulator with a substantially uniform thickness.

3. The semiconductor device according to claim 1, wherein
the fourth conductor has an electrical conductivity higher than an electrical conductivity of the second conductor.

4. The semiconductor device according to claim 1, wherein
the second conductor contains one of Mo, Ni, Cu, Co, Se, TaC, Pd, Au, Ir, Pt, Re, $RuO_2$, InSnO, SbSnO, WO, RhO, OsO, IrO, SrRuO, LaRhO, SrMoO, LaTiO, p-type Si, or p-type Ge.

5. The semiconductor device according to claim 1, wherein
the fourth conductor contains one of W, Cu, Mo, Ru, Rh, Co, AlCu, NiAl, or RuAl.

6. The semiconductor device according to claim 1, wherein
the second conductor has a work function higher than 4.8 eV.

7. The semiconductor device according to claim 1, wherein
the fourth conductor further includes a portion surrounding an entire outer periphery of the second conductor in a top view.

8. A semiconductor device, comprising:
a first conductor;
a first oxide semiconductor contacting, at one end, the first conductor, and extending in a first direction intersecting a surface of the first conductor;
a first insulator surrounding a side surface of the first oxide semiconductor;
a second conductor extending in a second direction intersecting the first direction, the second conductor and the first oxide semiconductor interposing the first insulator therebetween;
a second oxide semiconductor contacting another end of the first oxide semiconductor; and
a third conductor on the second oxide semiconductor, wherein
the second oxide semiconductor has a larger area than the first oxide semiconductor in a top view.

9. The semiconductor device according to claim 8, wherein
the second oxide semiconductor and the third conductor extend in a third direction intersecting the first direction and the second direction.

10. The semiconductor device according to claim 8, wherein
a Schottky barrier formed between the second oxide semiconductor and the first oxide semiconductor is smaller than a Schottky barrier formed between the second oxide semiconductor and the third conductor.

11. The semiconductor device according to claim 8, wherein
the first oxide semiconductor is of a material identical to a material of the second oxide semiconductor.

12. The semiconductor device according to claim 8, wherein
the first oxide semiconductor contains at least one of In, Zn, or Sn.

13. The semiconductor device according to claim 8, further comprising:
a fourth conductor between the second oxide semiconductor and the third conductor, wherein
the third conductor contains W, and
the fourth conductor contains one of indium tin oxide or an oxide semiconductor different from the first oxide semiconductor.

14. The semiconductor device according to claim 8, wherein
an upper portion of the first oxide semiconductor has a thickness larger than a thickness of a lower portion of the first oxide semiconductor, and
a side surface of the lower portion of the first oxide semiconductor is not positioned on an extension of a side surface of the upper portion of the first oxide semiconductor.

15. The semiconductor device according to claim 8, wherein the second oxide semiconductor is provided on a bottom surface and a side surface of the third conductor.

* * * * *